(12) United States Patent
Takeuchi et al.

(10) Patent No.: US 6,566,789 B2
(45) Date of Patent: May 20, 2003

(54) PIEZOELECTRIC/ELECTROSTRICTIVE DEVICE AND METHOD OF MANUFACTURING SAME

(75) Inventors: Yukihisa Takeuchi, Nishikamo-Gun (JP); Tsutomu Nanataki, Toyoaki (JP); Koji Ikeda, Kounan (JP); Koji Kimura, Nagoya (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/225,061

(22) Filed: Aug. 21, 2002

(65) Prior Publication Data

US 2003/0001455 A1 Jan. 2, 2003

Related U.S. Application Data

(62) Division of application No. 09/524,042, filed on Mar. 13, 2000, now Pat. No. 6,498,419.

(30) Foreign Application Priority Data

| Oct. 1, 1999 | (JP) | 11-281522 |
|---|---|---|
| Oct. 28, 1999 | (JP) | 11-307844 |
| Nov. 16, 1999 | (JP) | 11-326195 |
| Dec. 27, 1999 | (JP) | 11-371967 |
| Jan. 21, 2000 | (JP) | 2000-013576 |
| Jan. 24, 2000 | (JP) | 2000-015123 |
| Mar. 1, 2000 | (JP) | 2000-056434 |

(51) Int. Cl.[7] ............... H01L 41/24; H04R 17/00
(52) U.S. Cl. ............ 310/321; 310/328; 29/25.35
(58) Field of Search ................ 310/321, 328; 29/25.35

(56) References Cited

U.S. PATENT DOCUMENTS

| 4,612,440 A | 9/1986 | Brunée et al. ............ 250/281 |
| 5,166,571 A | 11/1992 | Konno et al. ............ 310/333 |
| 5,500,777 A | 3/1996 | Hasegawa et al. ........ 360/77.16 |
| 5,691,594 A | 11/1997 | Takeuchi et al. ........... 310/330 |
| 5,912,524 A | 6/1999 | Ohnishi et al. ............ 310/321 |
| 5,969,248 A | 10/1999 | Kurachi et al. .......... 73/504.12 |
| 6,018,212 A | 1/2000 | Kikuchi et al. ............ 310/321 |
| 6,049,158 A | 4/2000 | Takeuchi et al. ........... 310/328 |
| 6,109,104 A | 8/2000 | Fukuda et al. ........... 73/504.13 |
| 6,140,739 A | 10/2000 | Arai et al. ................ 310/321 |
| 6,246,552 B1 | 6/2001 | Soeno et al. ............ 360/294.4 |

FOREIGN PATENT DOCUMENTS

| JP | 63-64640 | 3/1988 |
| JP | 10-136665 | 5/1998 |

OTHER PUBLICATIONS

U.S. patent application Ser. No. 09/671,669, Takeuchi et al., filed Sep. 27, 2001.
U.S. patent application Ser. No. 09/642,861, Takeuchi et al., filed Sep. 21, 2000.
Yoshikazu Soeno, et al., "Piezoelectric Piggy–Back Microactuator for Hard Disk Drive," IEEE Transactions on Magnetics, vol. 35, No. 2, Mar. 1999, pp. 983–987.
S. Koganezawa, et al., "Dual–Stage Actuator System for Magnetic Disk Drive Using a Shear Mode Piezoelectric Microactuator," IEEE Transactions on Magnetics, vol. 35, No. 2, Mar. 1999, pp 998–992.

Primary Examiner—Lynn D. Feild
Assistant Examiner—Michael C. Zarroli
(74) Attorney, Agent, or Firm—Burr & Brown

(57) ABSTRACT

A piezoelectric/electrostrictive device comprises a pair of mutually opposing thin plate sections, a movable section, and a fixation section for supporting the thin plate sections and the movable section. A piezoelectric/electrostrictive element is arranged on at least one thin plate section of the pair of thin plate sections. A hole is formed by the inner walls of the pair of thin plate sections, the movable section and the fixation section. A central portion of the movable section is cut off to form mutually opposing end surfaces in the movable section.

7 Claims, 37 Drawing Sheets

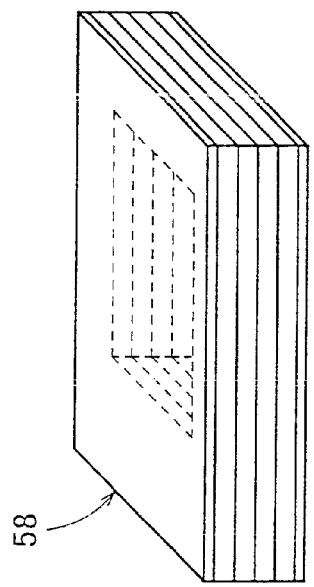
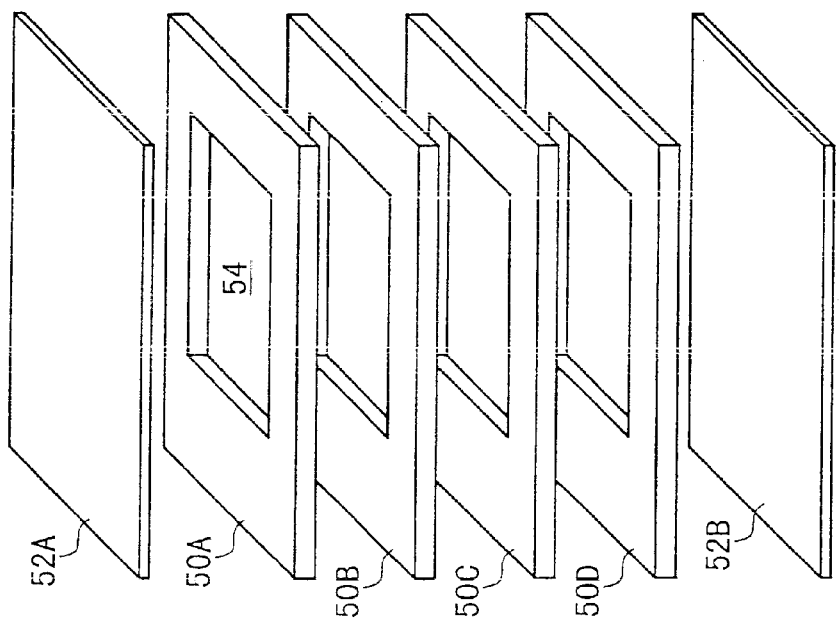

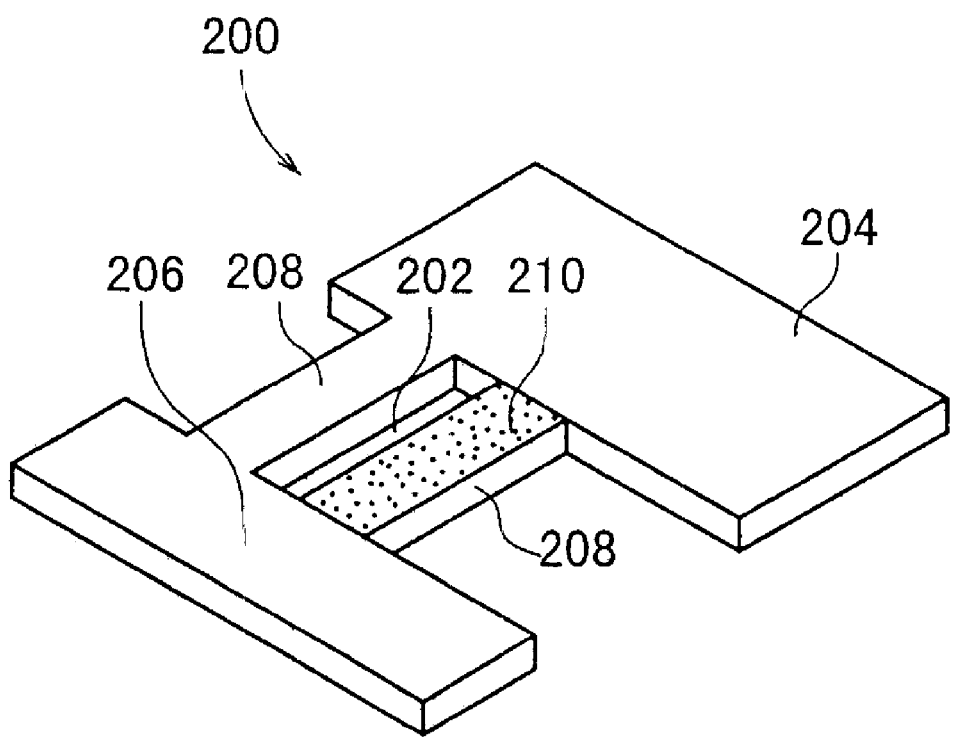
FIG. 37 - Prior Art

PIEZOELECTRIC/ELECTROSTRICTIVE DEVICE AND METHOD OF MANUFACTURING SAME

CROSS REFERENCE TO RELATED APPLICATION

This is a divisional application of U.S. Ser. No. 09/524,042, filed Mar. 13, 2000, now U.S. Pat. No. 6,498,419, now allowed, the entirety of which is incorporated herein by reference.

BACKGROUND OF THE INVENTION

1. Field of the Invention

The present invention relates to a piezoelectric/electrostrictive device which is provided with a movable section to be operated on the basis of a displacement action of a piezoelectric/electrostrictive element, or a piezoelectric/electrostrictive device which is capable of detecting displacement of a movable section by the aid of a piezoelectric/electrostrictive element, and a method for producing the same. In particular, the present invention relates to a piezoelectric/electrostrictive device which is excellent in strength, shock resistance, and moisture resistance and which makes it possible to efficiently operate a movable section to a great extent, and a method for producing the same.

2. Description of the Related Art

Recently, a displacement element, which makes it possible to adjust the optical path length and the position in an order of submicron, is required, for example, in the fields of optical science, magnetic recording, and precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material).

As shown in FIG. 38, for example, those hitherto disclosed as such a displacement element include a piezoelectric actuator comprising a fixation section 204, a movable section 206, and a beam section 208 for supporting them which are formed in an integrated manner with a hole 202 provided through a plate-shaped member 200 composed of a piezoelectric/electrostrictive material and with an electrode layer 210 provided on the beam section (see, for example, Japanese Laid-Open Patent Publication No. 10-136665).

The piezoelectric actuator is operated such that when a voltage is applied to the electrode layer 210, the beam section 208 extends and contracts in a direction along a line obtained by connecting the fixation section 204 and the movable section 206 in accordance with the inverse piezoelectric effect or the electrostrictive effect. Therefore, the movable section 206 can perform circular arc-shaped displacement or rotational displacement in the plane of the plate-shaped member 200.

On the other hand, Japanese Laid-Open Patent Publication No. 63-64640 discloses a technique in relation to an actuator based on the use of a bimorph. In this technique, electrodes for the bimorph are provided in a divided manner. The divided electrodes are selectively driven, and thus the highly accurate positioning is performed at a high speed. This patent document (especially in FIG. 4) discloses a structure in which, for example, two bimorphs are used in an opposed manner.

However, the piezoelectric actuator described above involves such a problem that the amount of operation of the movable section 206 is small, because the displacement in the direction of extension and contraction of the piezoelectric/electrostrictive material (i.e., in the in-plane direction of the plate-shaped member 200) is transmitted to the movable section 206 as it is.

All of the parts of the piezoelectric actuator are made of the piezoelectric/electrostrictive material which is a fragile material having a relatively heavy weight. Therefore, the following problems arise. That is, the mechanical strength is low, and the piezoelectric actuator is inferior in handling performance, shock resistance, and moisture resistance. Further, the piezoelectric actuator itself is heavy, and its operation tends to be affected by harmful vibrations (for example, residual vibration and noise vibration during high speed operation).

In order to solve the problems described above, it has been suggested that the hole 202 is filled with a filler material having flexibility. However, it is clear that the amount of displacement, which is brought about by the inverse piezoelectric effect or the electrostrictive effect, is decreased even when a filler material is employed.

Further, the actuator described in Japanese Laid-Open Patent Publication No. 63-64640 has such a structure that the bimorph itself is composed of two piezoelectric elements which are laminated with each other, in addition to the fact that the bimorph is stuck to a fixation member or a mediating member. Therefore, the stress tends to remain, resulting from, for example, the curing and the shrinkage of an adhesive and the heating treatment required for the sticking and the lamination. It is feared that the displacement action is disturbed by the internal residual stress, and it is impossible to realize the displacement and the resonance frequency as designed. Especially, when the actuator is small in size, the influence of the adhesive is increased by itself.

Accordingly, a method is conceived in order to exclude the influence of the adhesive required to effect the sticking, in which the actuator is composed of, for example, an integrated sintered product made of ceramics to give a structure in which no adhesive is used. However, also in this case, it is inevitably feared that the internal residual stress arises due to the difference in behavior of thermal shrinkage between respective members during the sintering.

Further, when the actuator is small in size, a problem is involved such that the fixation property of the actuator and the attachment property of the actuator to another part are deteriorated.

SUMMARY OF THE INVENTION

The present invention has been made taking the foregoing problems into consideration, an object of which is to provide a piezoelectric/electrostrictive device and a method for producing the same which make it possible to obtain a displacement element that is scarcely affected by harmful vibration and capable of high speed response with high mechanical strength while being excellent in handling performance, shock resistance, and moisture resistance. It is also an object of the present invention to realize a light weight of the device, especially a light weight of a movable section or a fixation section, and improve the handling performance of the device and the attachment performance for parts to be attached to the movable section or the fixation performance of the device, so that the movable section may be greatly displaced at a relatively low voltage. It is a further object of the present invention to achieve a high speed of the displacement action of the device, especially of the movable section (realization of a high resonance frequency), as well as a sensor element which makes it possible to accurately detect vibration of the movable section.

According to the present invention, there is provided a piezoelectric/electrostrictive device comprising a pair of mutually opposing thin plate sections, a movable section, and a fixation section for supporting the thin plate sections and the movable section; one or more piezoelectric/electrostrictive elements arranged on at least one thin plate section of the pair of thin plate sections; and a hole formed by both inner walls of the pair of thin plate sections, an inner wall of the movable section, and an inner wall of the fixation section; wherein any one of the movable section and the fixation section has mutually opposing end surfaces.

The movable section, the fixation section, and the thin plate section may be made of ceramics or metal. Alternatively, each of the components may be made of a ceramic material, or each of them may be made of a metal material. Further, each of the components may be constructed to have a hybrid structure obtained by combining those produced from materials of ceramics and metal.

It is also preferable that a cutoff section is provided on any one of the movable sections and the fixation section; and a part of the cutoff section constitutes the mutually opposing end surfaces. It is also preferable that the thin plate section, the movable section, and the fixation section are composed of a ceramic substrate integrated into one unit by simultaneously sintering a ceramic green stack and cutting off unnecessary portions. It is also preferable that the piezoelectric/electrostrictive element has a film-shaped configuration, and it is integrated with the ceramic substrate by means of sintering.

In this arrangement, the piezoelectric/electrostrictive element may have a piezoelectric/electrostrictive layer and a pair of electrodes formed on the piezoelectric/electrostrictive layer. It is also preferable that the piezoelectric/electrostrictive element has a piezoelectric/electrostrictive layer and a pair of electrodes formed on both sides of the piezoelectric/electrostrictive layer, and one electrode of the pair of electrodes is formed on at least the thin plate section. In this arrangement, the vibration caused by the piezoelectric/electrostrictive element can be efficiently transmitted via the thin plate section to the movable section or the fixation section. Thus, it is possible to improve the response performance. Especially, it is preferable that the piezoelectric/electrostrictive element is constructed in a stacked form comprising a plurality of units each including the piezoelectric/electrostrictive layer and a pair of electrodes.

When the arrangement as described above is adopted, the following feature is achieved. That is, the generated force of the piezoelectric/electrostrictive element is increased, and thus it is possible to obtain a large displacement. Further, it is possible to obtain a high resonance frequency owing to the increase in rigidity of the device itself, making it easy to achieve the high speed of the displacement action.

It is al so preferable that a gap is formed between the mutually opposing end surfaces. It is also preferable that a member, which is different from a constitutive member of the movable section, is interposed between the mutually opposing end surfaces, the different member including, for example, glass, cement, and organic resin, preferably organic resin such as those based on epoxy, acrylic, polyimide, phenol, silicone, terpene, xylene, styrene, melamine, methacrylic, and rubber, or mixture or copolymer thereof. Especially, in view of, for example, the joining performance, the handling performance, and the hardness, it is preferable to allow organic resin or the like based on epoxy, acrylic, and methacrylic to intervene. In order to further enhance the hardness, it is also preferable to mix a filler such as an inorganic material.

Especially, it is possible to effectively realize a light weight of the movable section or the fixation section by forming the gap between the mutually opposing end surfaces, allowing the member lighter than the constitutive member of the movable section or the fixation section to intervene between the mutually opposing end surfaces, or joining the end surfaces with the member. Accordingly, it is possible to increase the resonance frequency without decreasing the amount of displacement of the movable section or the fixation section. In view of the high resonance frequency, it is preferable that the member is made of a hard material.

When the gap is formed between the mutually opposing end surfaces, a part of the movable section or the fixation section including one end surface and another part of the movable section or the fixation section including the other end surface are more flexible, resulting in strong resistance to the deformation. Therefore, it is possible to obtain excellent handling performance of the piezoelectric/electrostrictive device.

The existence of the mutually opposing end surfaces increases the surface area of the movable section or the fixation section. Therefore, when the movable section has mutually opposing end surfaces, the attachment area can be increased when another part is attached to the movable section. Thus, it is possible to improve the attachment performance for the part. It is now assumed that the part is secured, for example, with an adhesive or the like. In this case, the adhesive is fully distributed to the end surfaces as well as to the first principal surface of the movable section. Therefore, it is possible to dissolve, for example, shortage of application of the adhesive. Thus, it is possible to reliably secure the part.

On the other hand, when the fixation section has mutually opposing end surfaces, it is possible to strongly fix the piezoelectric/electrostrictive device according to this invention to a predetermined fixation portion. Thus, it is possible to improve the reliability.

As described above, according to the present invention, it is possible to obtain the displacement element which is scarcely affected by harmful vibration and capable of high speed response with high mechanical strength while being excellent in handling performance, shock resistance, and moisture resistance, making it possible to realize a light weight of the device, especially a light weight of the movable section or the fixation section, and improve the handling performance of the device and the attachment performance for parts to be attached to the movable section or the fixation performance of the device, so that the movable section may be greatly displaced, and it is possible to achieve a high speed of the displacement action of the movable section (realization of a high resonance frequency), as well as the sensor element which makes it possible to accurately detect vibration of the movable section.

In the production of the piezoelectric/electrostrictive device, for example, when the piezoelectric/electrostrictive element is formed on a ceramic stack (obtained by stacking ceramic green sheets followed by sintering into one unit), for example, by means of the lamination or the integrated sintering based on the use of the film formation method as described later on, the internal residual stress is generated at a portion to be formed into the piezoelectric/electrostrictive element and/or the thin plate section. Especially, when the piezoelectric/electrostrictive element is formed on the ceramic stack by means of the integrated sintering, the internal residual stress tends to be generated at the portion to be converted into the piezoelectric/electrostrictive element and/or the thin plate section, due to the shrinkage and the difference in coefficient of thermal expansion of the constitutive members caused during the sintering.

The internal residual stress still remains in the piezoelectric/electrostrictive element and/or the thin plate section even after unnecessary portions of the ceramic stack are cut off to provide the ceramic substrate having the movable section, the fixation section, and the thin plate sections.

If the piezoelectric/electrostrictive device is produced and used starting from this state, the movable section does not exhibit the desired displacement in some cases even when a predetermined electric field is generated in the piezoelectric/electrostrictive layer for constructing the piezoelectric/electrostrictive element, because of the following reason. That is, the material characteristic of the piezoelectric/electrostrictive layer and the displacement action of the movable section are inhibited by the internal residual stress generated in the piezoelectric/electrostrictive element and/or the thin plate section.

In the present invention, the mutually opposing end surfaces are provided on any one of the movable section and the fixation section. Therefore, the distance between the end surfaces is, for example, shortened by the internal residual stress generated in the piezoelectric/electrostrictive element and/or the thin plate section. That is, the internal residual stress, which has been generated in the piezoelectric/electrostrictive element and/or the thin plate section, is released by the movement of the end surfaces.

Therefore, the displacement action of the movable section is not inhibited by the internal residual stress. It is possible to obtain the displacement action of the movable section as approximately designed and expected. Additionally, the release of the stress also makes it possible to improve the mechanical strength of the device.

In the invention described above, it is also preferable that the hole is filled with a gel material. In this arrangement, although the displacement action of the movable section is restricted due to the presence of the filler material, the invention described above intends to reduce the weight as a result of the formation of the end surfaces on the movable section or the fixation section, and increase the displacement amount of the movable section. Therefore, the restriction of the displacement action of the movable section by the filler material is counteracted, and it is possible to realize the effect owing to the presence of the filler material, i.e., the realization of the high resonance frequency and the maintenance of the rigidity.

According to another aspect of the present invention, there is provided a method for producing a piezoelectric/electrostrictive device comprising a pair of mutually opposing thin plate sections, a movable section, and a fixation section for supporting the thin plate sections and the movable section; one or more piezoelectric/electrostrictive elements arranged on at least one thin plate section of the pair of thin plate sections; and a hole formed by both inner walls of the pair of thin plate sections, an inner wall of the movable section, and an inner wall of the fixation section; the method comprising a step of forming the movable section or the fixation section having mutually opposing end surfaces by cutting off a predetermined part of any one of a portion to be formed into the movable section or a portion to be formed into the fixation section after producing at least the piezoelectric/electrostrictive element.

As a result, there is provided the movable section and the fixation section which has the mutually opposing end surfaces. Accordingly, the internal residual stress, which has been generated in the piezoelectric/electrostrictive element and/or the thin plate section during the production, is released, for example, by shortening the distance between the end surfaces. Therefore, the displacement action of the movable section is not inhibited by the internal residual stress.

The phrase "after producing the piezoelectric/electrostrictive element" referred to herein indicates a state in which at least the piezoelectric/electrostrictive layer is formed. As for the electrode to be formed after the formation of the piezoelectric/electrostrictive layer, the electrode may be formed after performing the cutoff to form the movable section or the fixation section having the mutually opposing end surfaces.

The provision of the movable section or the fixation section having mutually opposing end surfaces realizes the light weight of the movable section or the fixation section. Therefore, the piezoelectric/electrostrictive device, which makes it possible to increase the resonance frequency, can be efficiently produced with ease without decreasing the amount of displacement of the movable section. Thus, it is possible to realize the mass production of the high performance piezoelectric/electrostrictive device.

Further, the movable section or the fixation section is bent more flexibly, and it is strongly resistant to deformation. Therefore, the piezoelectric/electrostrictive device is excellent in handling performance. The presence of the mutually opposing end surfaces increases the surface area of the movable section or the fixation section. When another part is attached to the movable section, or when the device is fixed at a predetermined fixation position, it is possible to provide a large attachment area or a large fixation area thereof. Thus, it is possible to improve the attachment performance for the part and the fixation performance of the device.

According to still another aspect of the present invention, there is provided a method for producing a piezoelectric/electrostrictive device comprising a pair of mutually opposing thin plate sections, a movable section, and a fixation section for supporting the thin plate sections and the movable section; one or more piezoelectric/electrostrictive elements arranged on at least one thin plate section of the pair of thin plate sections; and a hole formed by both inner walls of the pair of thin plate sections, an Inner wall of the movable section, and an inner wall of the fixation section; the method comprising a step of producing a ceramic stack by integrally sintering a ceramic green stack including at least a ceramic green sheet having a window for forming at least the hole thereafter and ceramic green sheets to be formed into the thin plate sections thereafter to produce the ceramic stack; a step of forming the piezoelectric/electrostrictive element on an outer surface of a portion of the ceramic stack to be formed into the thin plate section; and a cutoff step of forming the movable section or the fixation section having at least mutually opposing end surfaces by means of at least one time of cutoff treatment for the ceramic stack formed with the piezoelectric/electrostrictive element.

Accordingly, in the production of the piezoelectric/electrostrictive device, especially when the piezoelectric/electrostrictive element is formed on the ceramic stack by means of the sintering, the internal residual stress, which is generated in the piezoelectric/electrostrictive element and/or the thin plate section, can be effectively released. Therefore, when the piezoelectric/electrostrictive device is produced by using the ceramic green sheet-stacking method, it is possible to realize a light weight of the device, especially the light weight of the movable section or the fixation section, and improve the handling performance of the device, the attachment performance for parts to be attached to the movable section, and the fixation performance of the device. Thus, it is possible to allow the movable section to make a large displacement.

It is also preferable that in the step of producing the ceramic stack, the ceramic stack is produced by integrally sintering a ceramic green stack including a ceramic green sheet having a window for forming the movable section or the fixation section having at least the mutually opposing end surfaces, and the ceramic green sheets to be formed into the thin plate sections thereafter to produce the ceramic stack; and in the cutoff step, the movable section or the fixation section having at least the mutually opposing end surfaces is formed by means of the cutoff treatment for the ceramic stack formed with the piezoelectric/electrostrictive element.

It is also preferable that in the step of producing the ceramic stack, the ceramic stack is produced by integrally sintering a ceramic green stack including a ceramic green sheet having a window for forming a portion to be formed into the movable section or a portion to be formed into the fixation section having at least mutually opposing end surfaces partially connected to one another, and the ceramic green sheets to be formed into the thin plate sections thereafter to produce the ceramic stack; and in the cutoff step, the portion to be formed into the movable section or the portion to be formed into the fixation section having at least the mutually opposing end surfaces partially connected to one another is formed by means of the cutoff treatment for the ceramic stack formed with the piezoelectric/electrostrictive element, and the movable section or the fixation section having the mutually opposing end surfaces is formed by cutting off the connecting portion.

It is also preferable for the production method that in the cutoff step, the hole is simultaneously exposed by means of the cutoff treatment for the ceramic stack. In this process, the formation of the movable section or the fixation section having the mutually opposing end surfaces may be performed simultaneously with the formation of the hole. There is no limitation for the sequence to perform the formation steps.

It is also preferable that the production method further comprises a step of allowing a member different from a constitutive member of the movable section to intervene between the mutually opposing end surfaces.

Therefore, the piezoelectric/electrostrictive device according to the present invention can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device according to the present invention can be preferably utilized for various actuators to be used for the mechanism for adjusting the displacement and the positioning and for adjusting the angle for various precision parts such as those of optical instruments and precision mechanical equipments.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 16A illustrates a process for stacking necessary ceramic green sheets in a first production method;

FIG. 16B illustrates a state in which a ceramic green stack is formed;

FIG. 37 shows an arrangement of a piezoelectric/electrostrictive device concerning an illustrative conventional technique.

DESCRIPTION OF THE PREFERRED EMBODIMENTS

Explanation will be made below with reference to FIGS. 1 to 36 for illustrative embodiments of the piezoelectric/electrostrictive device and the production method for the same according to the present invention.

It is noted that the piezoelectric/electrostrictive device resides in a concept which includes the element for mutually converting the electric energy and the mechanical energy by the aid of the piezoelectric/electrostrictive element. Therefore, the piezoelectric/electrostrictive device is most preferably used as the active element such as various actuators and vibrators, especially as the displacement element based on the use of the displacement brought about by the inverse piezoelectric effect or the electrostrictive effect. Additionally, the piezoelectric/electrostrictive device is also preferably used as the passive element such as acceleration sensor elements and shock sensor elements.

Figure 1:
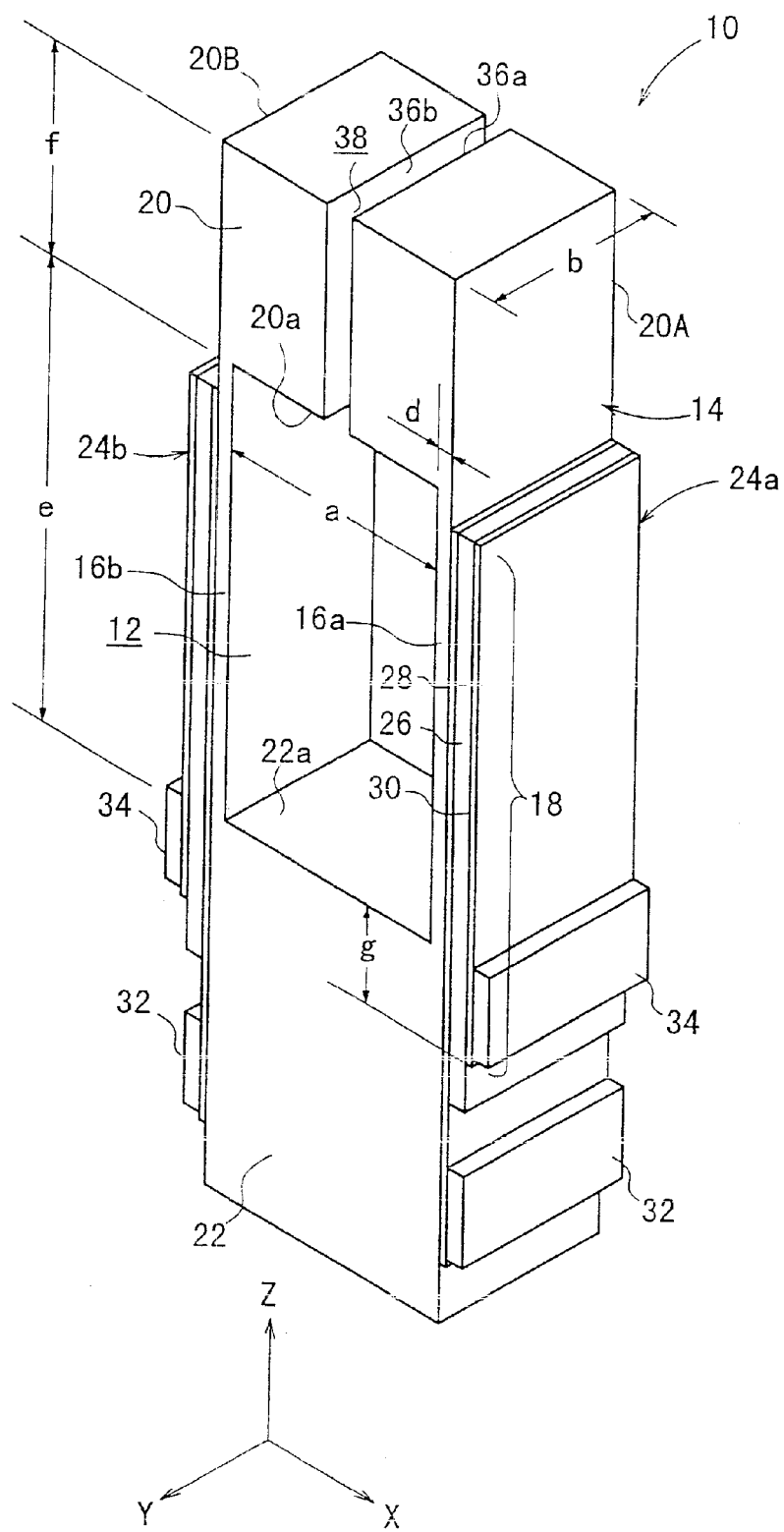
FIG. 1 shows a perspective view illustrating an arrangement of a piezoelectric/electrostrictive device according to an embodiment of the present invention.
Figure 2:
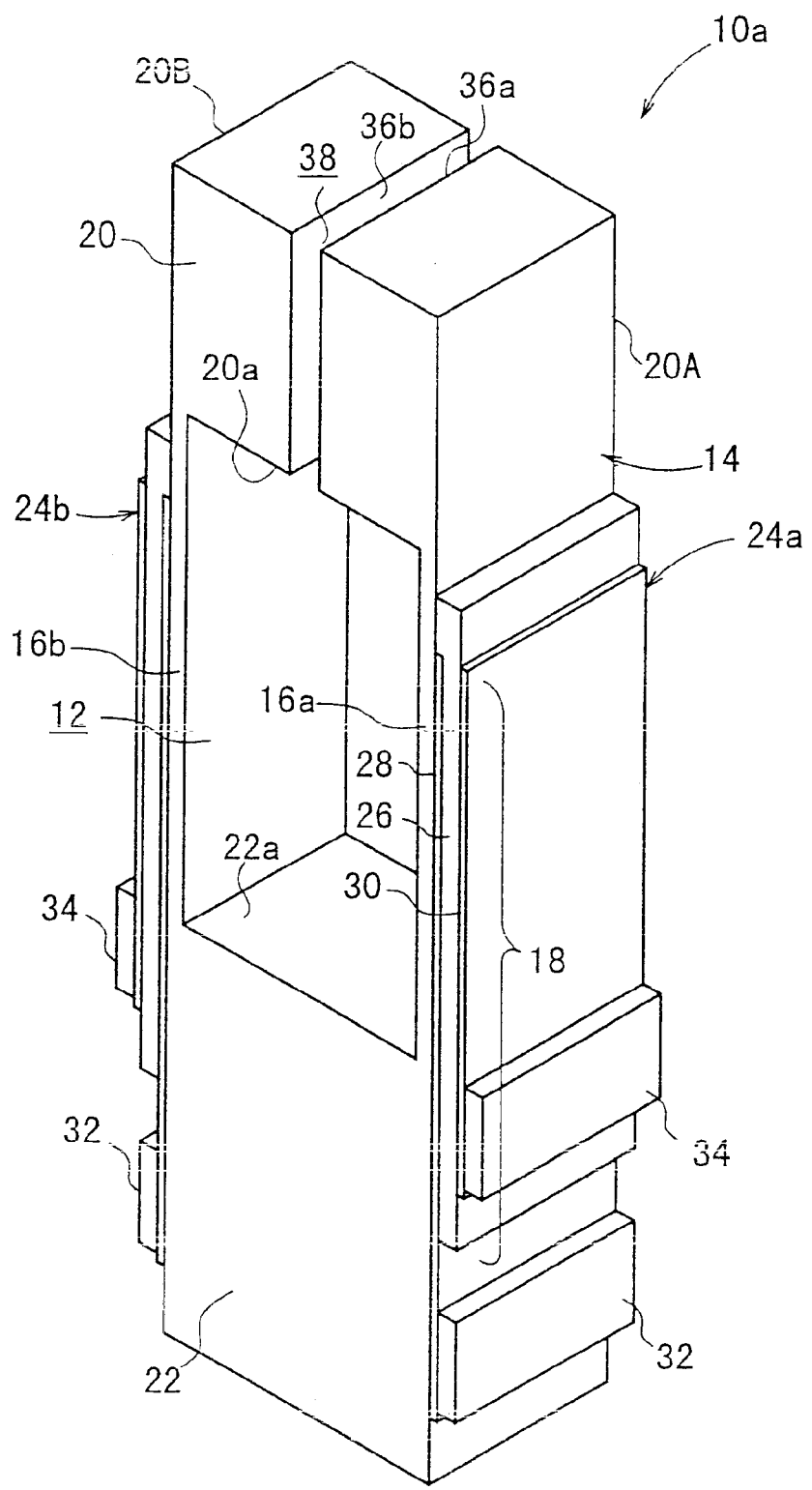
FIG. 2 shows a perspective view illustrating a first modified embodiment of the piezoelectric/electrostrictive device according to the embodiment of the present invention.

As shown in FIG. 1, the piezoelectric/electrostrictive device 10 according to this embodiment has a substrate 14 which has a lengthy rectangular parallelepiped-shaped configuration as a whole and which has a hole 12 provided at an approximately central portion in the major axis direction thereof.

The substrate 14 comprises a pair of mutually opposing thin plate sections 16a, 16b, a movable section 20, and a fixation section 22 for supporting the pair of thin plate sections 16a, 16b and the movable section 20. Piezoelectric/electrostrictive elements 24a, 24b are formed at respective parts of at least the thin plate sections 16a, 16b respectively.

Those usable as the substrate 14 include a structure comprising ceramics or metal as a whole, and a hybrid structure obtained by combining products produced with materials of ceramics and metal.

Those adoptable for the substrate 14 include, for example, a structure in which respective parts are glued to one another with an adhesive such as organic resin and glass, a ceramic integrated structure which is obtained by sintering and integrating a ceramic green stack into one unit, and a metal integrated structure integrated by brazing, soldering, eutectic bonding, or welding into one unit. Preferably, it is desirable to construct the substrate 14 with a ceramic stack integrated into one unit by sintering a ceramic green stack.

The time-dependent change of state scarcely occurs in the integrated product of ceramic, because no adhesive exists at joined portions between the respective parts. Therefore, the reliability of the joined portion is high, giving a structure which is advantageous to ensure the rigidity. Additionally, the integrated product of ceramic can be produced with ease by means of the method for stacking ceramic green sheets as described later on.

The piezoelectric/electrostrictive elements 24a, 24b are prepared as separate members as described later on, and the prepared piezoelectric/electrostrictive elements 24a, 24b are stuck to the substrate 14 with an adhesive such as organic resin or glass or by means of brazing, soldering, or eutectic bonding. Alternatively, the piezoelectric/electrostrictive elements 24a, 24b are directly formed on the substrate 14 by using the film formation method and not by using the sticking method described above.

The piezoelectric/electrostrictive device 10 includes the hole 12 having, for example, a rectangular configuration which is formed by both inner walls of the pair of thin plate sections 16a, 16b, an inner wall 20a of the movable section 20, and an inner wall 22a of the fixation section 22. The piezoelectric/electrostrictive device 10 is constructed such that the movable section 20 is displaced in accordance with the driving of the piezoelectric/electrostrictive element or elements 24a and/or 24b, or the displacement of the movable section 20 is detected by the piezoelectric/electrostrictive element or elements 24a and/or 24b.

Each of the piezoelectric/electrostrictive elements 24a, 24b comprises a piezoelectric/electrostrictive layer 26, and a pair of electrodes 28, 30 formed on both sides of the piezoelectric/electrostrictive layer 26. One electrode 28 of the pair of electrodes 28, 30 is formed at least on each of the pair of thin plate sections 16a, 16b.

In the embodiment shown in FIG. 1, respective forward end surfaces of the pair of electrodes 28, 30 and the piezoelectric/electrostrictive layer 26 for constructing the piezoelectric/electrostrictive element 24a, 24b are substantially aligned. A substantial driving portion 18 of the piezoelectric/electrostrictive element 24a, 24b (portion at which the pair of electrodes 28, 30 are overlapped with each other with the piezoelectric/electrostrictive layer 26 interposed therebetween) is continuously formed over a range from a part of the outer circumferential surface of the fixation section 22 to a part of the outer circumferential surface of the thin plate section 16a, 16b. Especially, in this embodiment, the respective forward end surfaces of the pair of electrodes 28, 30 are located at the positions slightly deviated rearwardly from the inner wall 20a of the movable section 20. Of course, the piezoelectric/electrostrictive element 24a, 24b may be formed such that the substantial driving portion 18 is located over a range from a part of the movable section 20 to a part of the thin plate section 16a, 16b.

Figure 12:
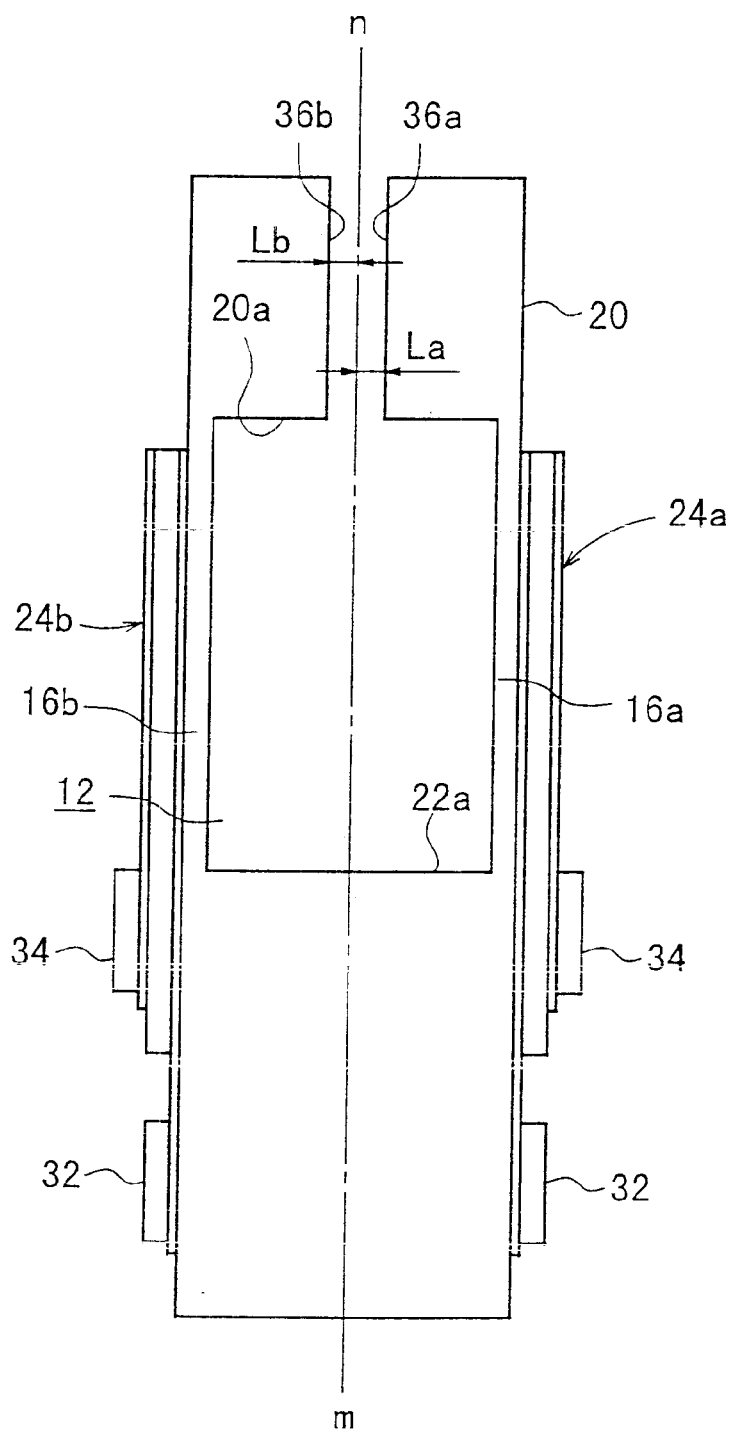
FIG. 12 illustrates a situation in which both of the piezoelectric/electrostrictive elements do not make the displacement action in the piezoelectric/electrostrictive device according to the embodiment of the present invention.

As shown in FIG. 1, the piezoelectric/electrostrictive device 10 according to the embodiment described above includes mutually opposing end surfaces 36a, 36b which are formed in the movable section 20. Each of the end surfaces 36a, 36b is a surface substantially parallel to the side surface of the movable section 20, i.e., the surface for forming the element. The respective end surfaces 36a, 36b are separated from each other from the upper surface of the movable section 20 to the hole 12. In this arrangement, as shown in FIG. 12, for example, it is preferable that the distances La, Lb, which range from the central axis n of the movable section 20 to the respective end surfaces 36a, 36b, are substantially equal to one another.

As shown in FIG. 1, for example, a gap (air) 38 may be allowed to intervene between the end surfaces 36a, 36b. Alternatively, as in a piezoelectric/electrostrictive device 10g according to a seventh modified embodiment shown in FIG. 9, a member different from the constitutive member of the movable section 20, for example, a member 40 composed of, for example, resin or the like may be allowed to intervene between the end surfaces 36a, 36b.

The voltage is applied to the pair of electrodes 28, 30 via terminals (pads) 32, 34 of the respective electrodes 28, 30 formed on both side surfaces (element formation surfaces) of the fixation section 22 respectively. The respective terminals 32, 34 are positioned as follows. That is, the terminal 32 corresponding to the first electrode 28 is formed at a position deviated toward the rearward end of the fixation section 22. The terminal 34 corresponding to the second electrode 30 is disposed on the side of the external space and is formed at a position deviated toward the inner wall 22a of the fixation section 22.

In this embodiment, the piezoelectric/electrostrictive device 10 can be individually fixed by utilizing the surfaces respectively different from the surfaces on which the terminals 32, 34 are arranged. As a result, it is possible to obtain a high reliability for both the fixation of the piezoelectric/electrostrictive device 10 and the electric connection between the circuit and the terminals 32, 34. In this arrangement, the electric connection between the terminals 32, 34 and the circuit is made, for example, by means of a flexible printed circuit (also referred to as FPC), a flexible flat cable (also referred to as FFC), and a wire bonding.

Figure 3:
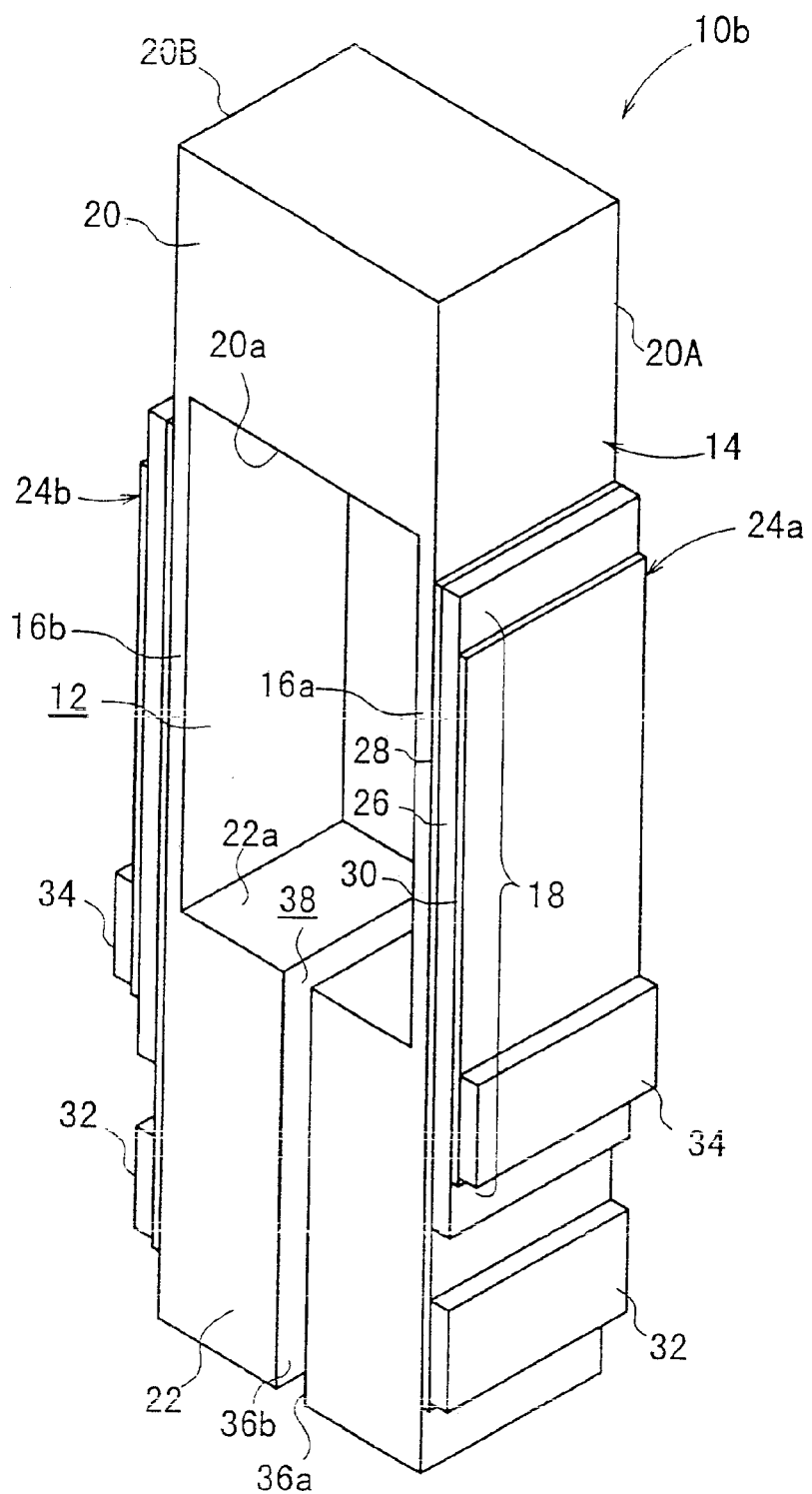
FIG. 3 shows a perspective view illustrating a second modified embodiment of the piezoelectric/electrostrictive device according to the embodiment of the present invention.

Structures other than the structure shown in FIG. 1 are available for the piezoelectric/electrostrictive element 24a, 24b. That is, as in a piezoelectric/electrostrictive device 10a according to a first modified embodiment shown in FIG. 2, it is also preferable that the respective forward ends of the pair of electrodes 28, 30 for constructing the piezoelectric/electrostrictive element 24a, 24b are aligned, and only the forward end of the piezoelectric/electrostrictive layer 26 is allowed to protrude toward the movable section 20. Alternatively, as in a piezoelectric/electrostrictive device 10b according to a second modified embodiment shown in FIG. 3, it is also preferable that the respective forward ends of the first electrode 28 and the piezoelectric/electrostrictive layer 26 are aligned, and only the forward end of the second electrode 30 is disposed at a position deviated toward the fixation section 22. The piezoelectric/electrostrictive device 10b shown in FIG. 3 is illustrative of the case in which mutually opposing end surfaces 36a, 36b are provided in the fixation section 22 in place of the movable section 20.

Figure 4:
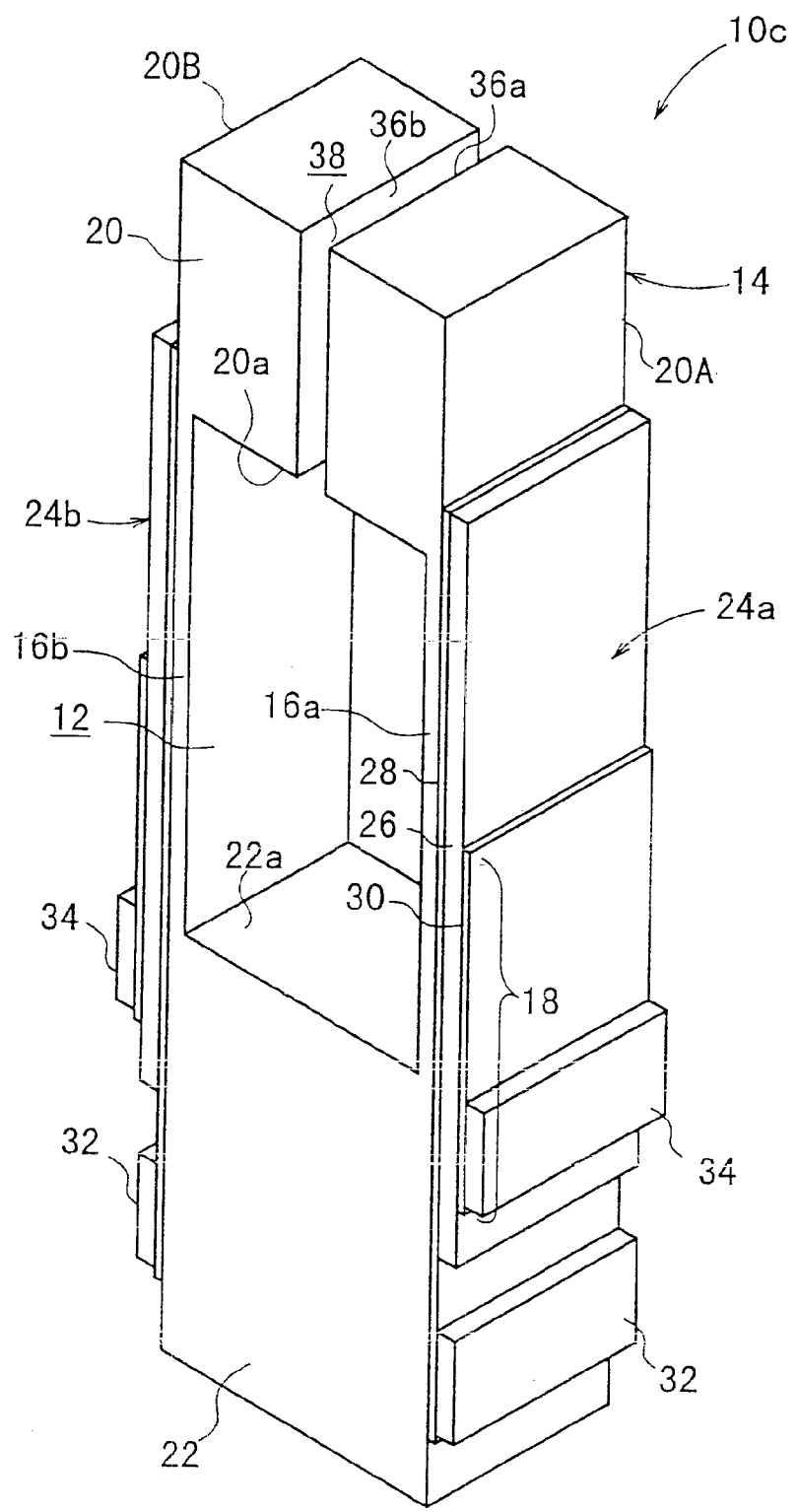
FIG. 4 shows a perspective view illustrating a third modified embodiment of the piezoelectric/electrostrictive device according to the embodiment of the present invention.

Alternatively, as in a piezoelectric/electrostrictive device 10c according to a third modified embodiment shown in FIG. 4, it is also preferable that the respective forward ends of the first electrode 28 and the piezoelectric/electrostrictive layer 26 are allowed to extend up to the side surface of the movable section 20, and the forward end of the second electrode 30 is located at an approximately central portion in the length direction (Z axis direction) of the thin plate section 16*a*, 16*b*.

In the embodiments described above, the piezoelectric/electrostrictive element 24*a*, 24*b* is constructed by the piezoelectric/electrostrictive layer 26 having the one-layered structure and the pair of electrodes 28, 30. Alternatively, it is also preferable that the piezoelectric/electrostrictive element 24*a*, 24*b* is constructed in a stacked form composed of a plurality of units each comprising the piezoelectric/electrostrictive layer 26 and the pair of electrodes 28, 30.

Figure 5:
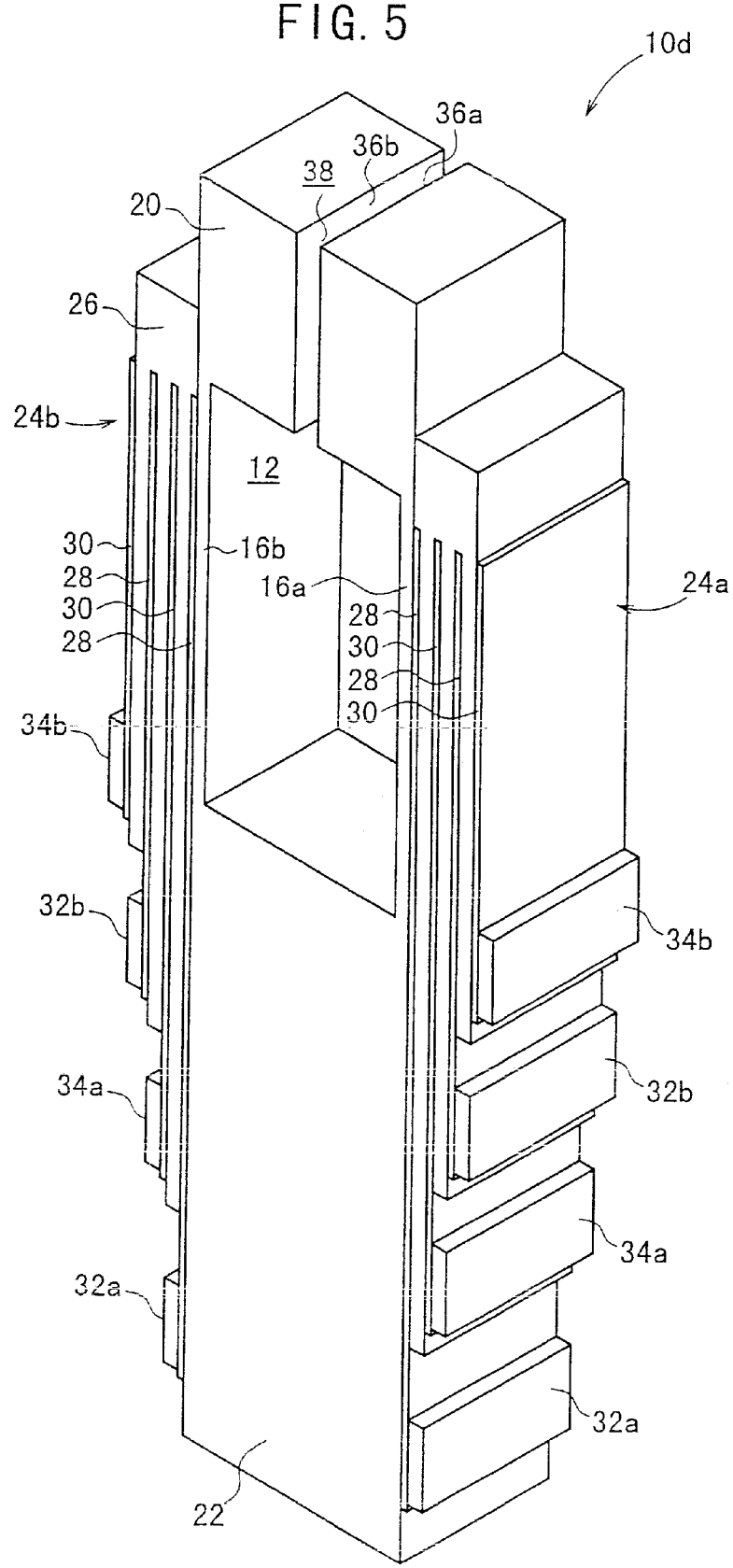
FIG. 5 shows a perspective view illustrating a fourth modified embodiment of the piezoelectric/electrostrictive device according to the embodiment of the present invention.

For example, as in a piezoelectric/electrostrictive device 10*d* according to a fourth modified embodiment shown in FIG. 5, each of the piezoelectric/electrostrictive layer 26 and the pair of electrodes 28, 30 resides in a multilayered structure. The first electrode 28 and the second electrode 30 are alternately stacked with each other to provide the piezoelectric/electrostrictive element 24*a*, 24*b* which has a multiple stage structure at a portion (see FIG. 1, i.e., substantial driving portion 18) at which the pair of electrodes 28 and the pair of electrodes 30 are overlapped with each other with the piezoelectric/electrostrictive layer 26 interposed therebetween. FIG. 5 is illustrative of the following case. That is, the piezoelectric/electrostrictive layer 26 has a three-layered structure. The first electrode 28 is formed on the lower surface of the first layer (side surface of thin plate sections 16*a* and 16*b*) and on the upper surface of the second layer of the piezoelectric/electrostrictive element 24*a* and 24*b*. The second electrode 30 is formed on the upper surface of the first layer and on the upper surface of the third layer of the piezoelectric/electrostrictive element 24*a* and 24*b*. Further, terminals 32*a*, 32*b* are provided on respective ends of the first electrodes 28 respectively, and terminals 34*a*, 34*b* are provided on respective ends of the second electrodes 30, respectively.

Figure 6:
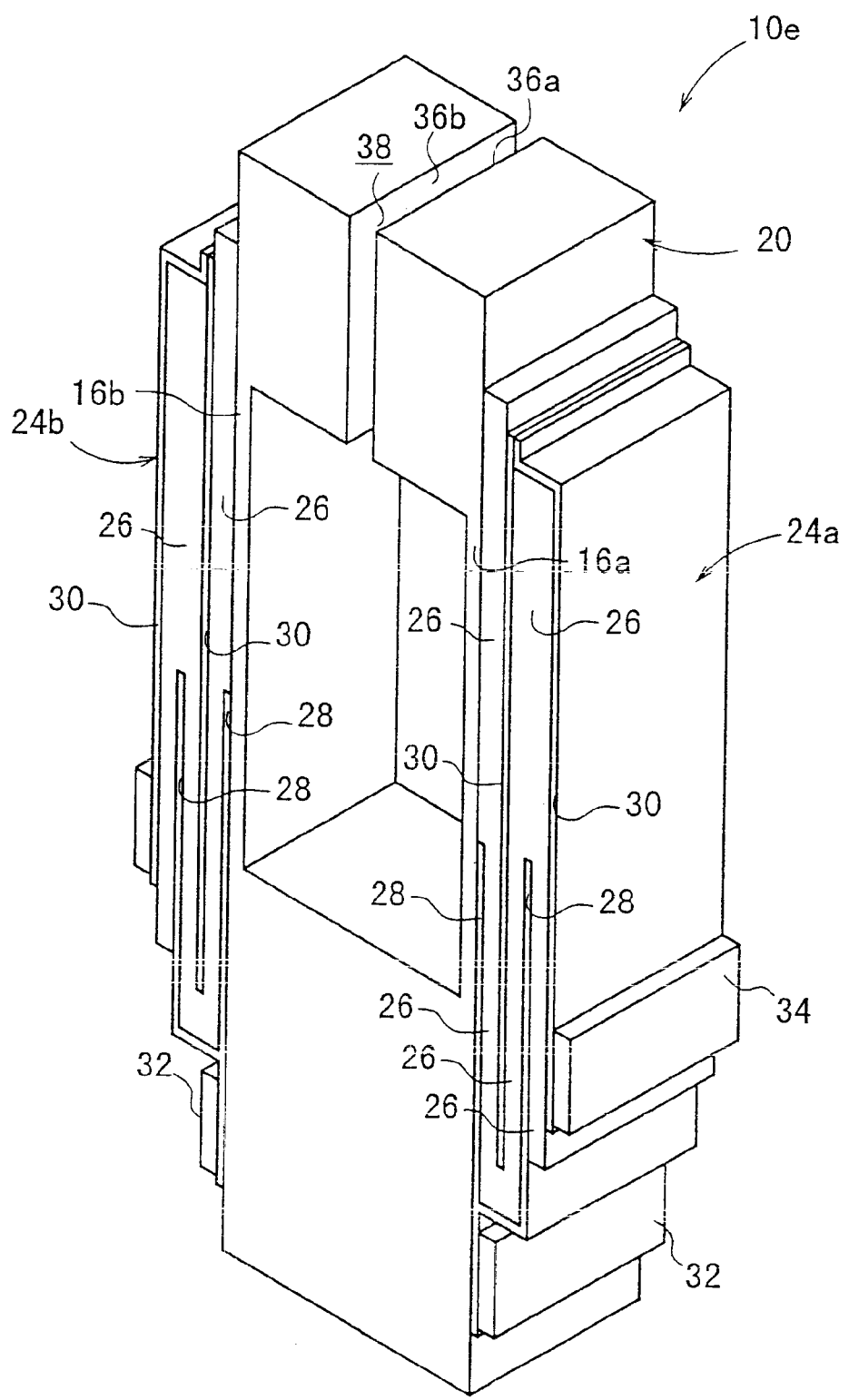
FIG. 6 shows a perspective view illustrating a fifth modified embodiment of the piezoelectric/electrostrictive device according to the embodiment of the present invention.

As in a piezoelectric/electrostrictive device 10*e* according to a fifth modified embodiment shown in FIG. 6, each of the piezoelectric/electrostrictive layer 26 and the pair of electrodes 28, 30 resides in a multilayered structure. The first electrode 28 and the second electrode 30 are alternately stacked with each other so that a substantially comb-shaped configuration is obtained in cross section to provide the piezoelectric/electrostrictive element 24*a*, 24*b* which has a multiple stage structure at a portion (see FIG. 1, i.e., substantial driving portion 18) at which the pair of electrodes 28 and the pair of electrodes 30 are overlapped with each other with the piezoelectric/electrostrictive layer 26 interposed therebetween. FIG. 6 is illustrative of the following case. That is, the piezoelectric/electrostrictive layer 26 has the three-layered structure. The first electrode 28 is formed in a comb-shaped configuration to be located on the lower surface of the first layer (side surface of the thin plate section 16*a*, 16*b*) and on the upper surface of the second layer. The second electrode 30 is formed in a comb-shaped configuration to be located on the upper surface of the first layer and on the upper surface of the third layer. In the case of this structure, each of the first electrode 28 and the second electrode 30 is continuous and common. Accordingly, it is possible to decrease the number of terminals 32, 34 as compared with the structure shown in FIG. 5. Therefore, it is possible to fabricate the piezoelectric/electrostrictive element in a smaller size than would otherwise be required in a multilayered structure.

Figure 7:
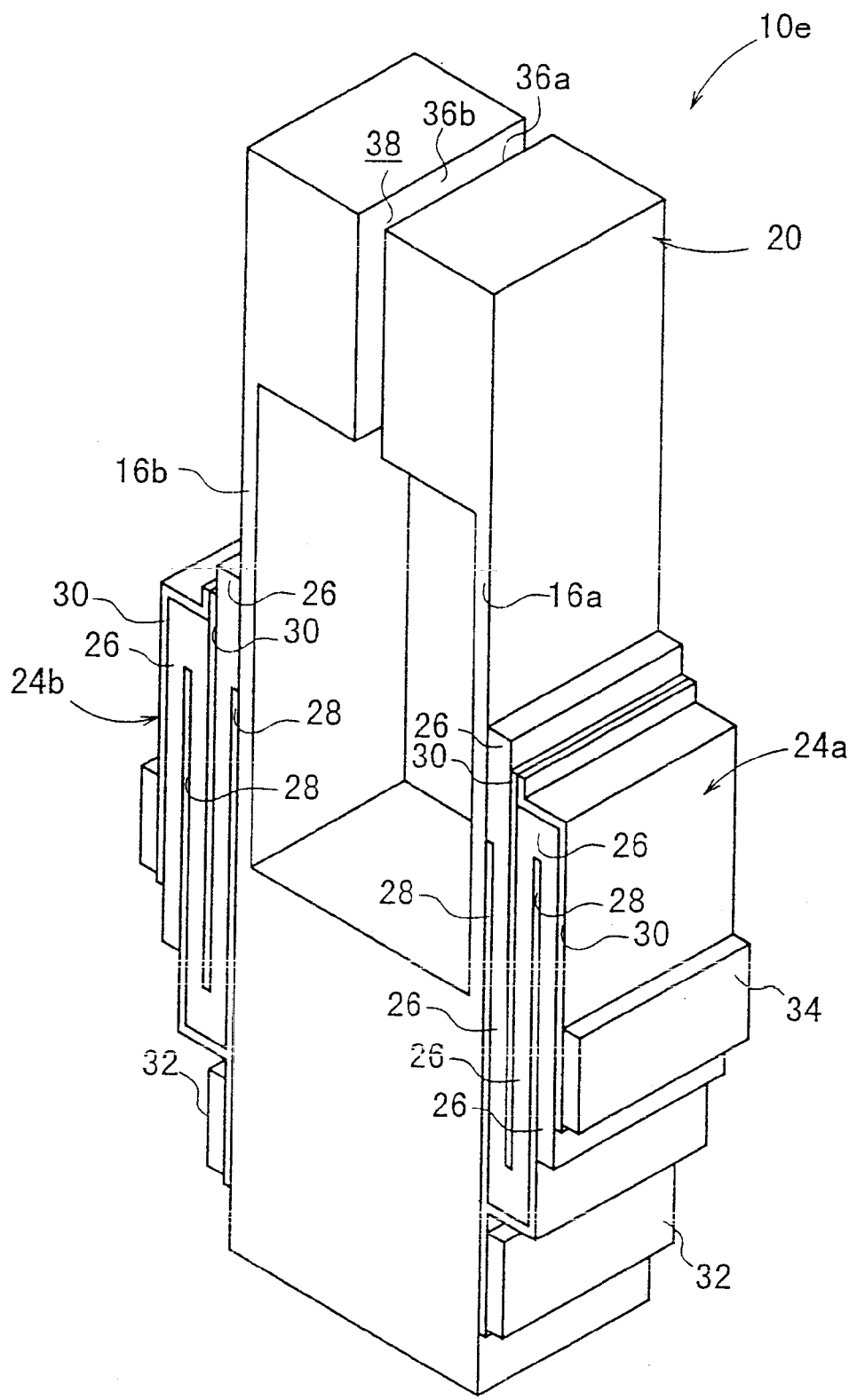
FIG. 7 shows a perspective view illustrating another embodiment of the piezoelectric/electrostrictive device concerning the fifth modified embodiment.

Another example of the piezoelectric/electrostrictive device 10*e* according to the fifth embodiment is shown in FIG. 7. In this case, it is also preferable to form the piezoelectric/electrostrictive element 24*a*, 24*b* so that the forward end thereof stays on the thin plate section 16*a*, 16*b*. FIG. 7 is illustrative of the case in which the forward end of the piezoelectric/electrostrictive element 24*a*, 24*b* is located at a substantially central portion in the length direction of the thin plate section. This arrangement is advantageous in that the movable section 20 can be displaced to a great extent.

Figure 8:
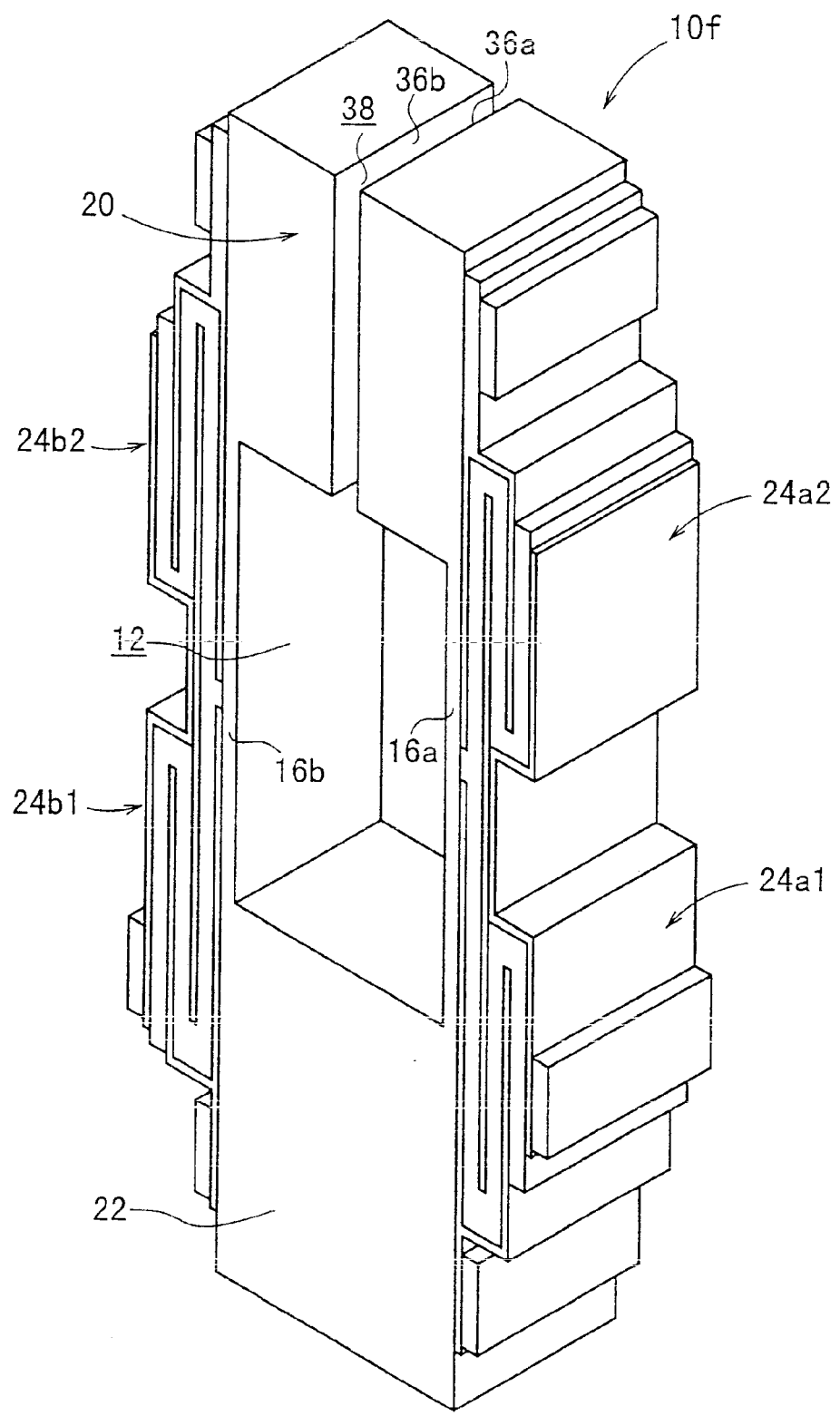
FIG. 8 shows a perspective view illustrating a sixth modified embodiment of the piezoelectric/electrostrictive device according to the embodiment of the present invention.

Alternatively, as in a piezoelectric/electrostrictive device 10*f* according to a sixth modified embodiment shown in FIG. 8, it is also preferable that two piezoelectric/electrostrictive elements 24*a*1, 24*b*1 having the multiple stage structure are formed to extend over the fixation section 22 and the thin plate section 16*a*, 16*b* respectively, and another two piezoelectric/electrostrictive elements 24*a*2, 24*b*2 having the multiple stage structure are formed to extend over the movable section 20 and the thin plate section 16*a*, 16*b* respectively. In this arrangement, the movable section 20 can be displaced to an extremely great extent due to the multiple stage structure and the increase in the number of points of action employed to displace the movable section 20. Further, the piezoelectric/electrostrictive device 10*f* is excellent in high speed response performance, which is preferred.

Figure 9:
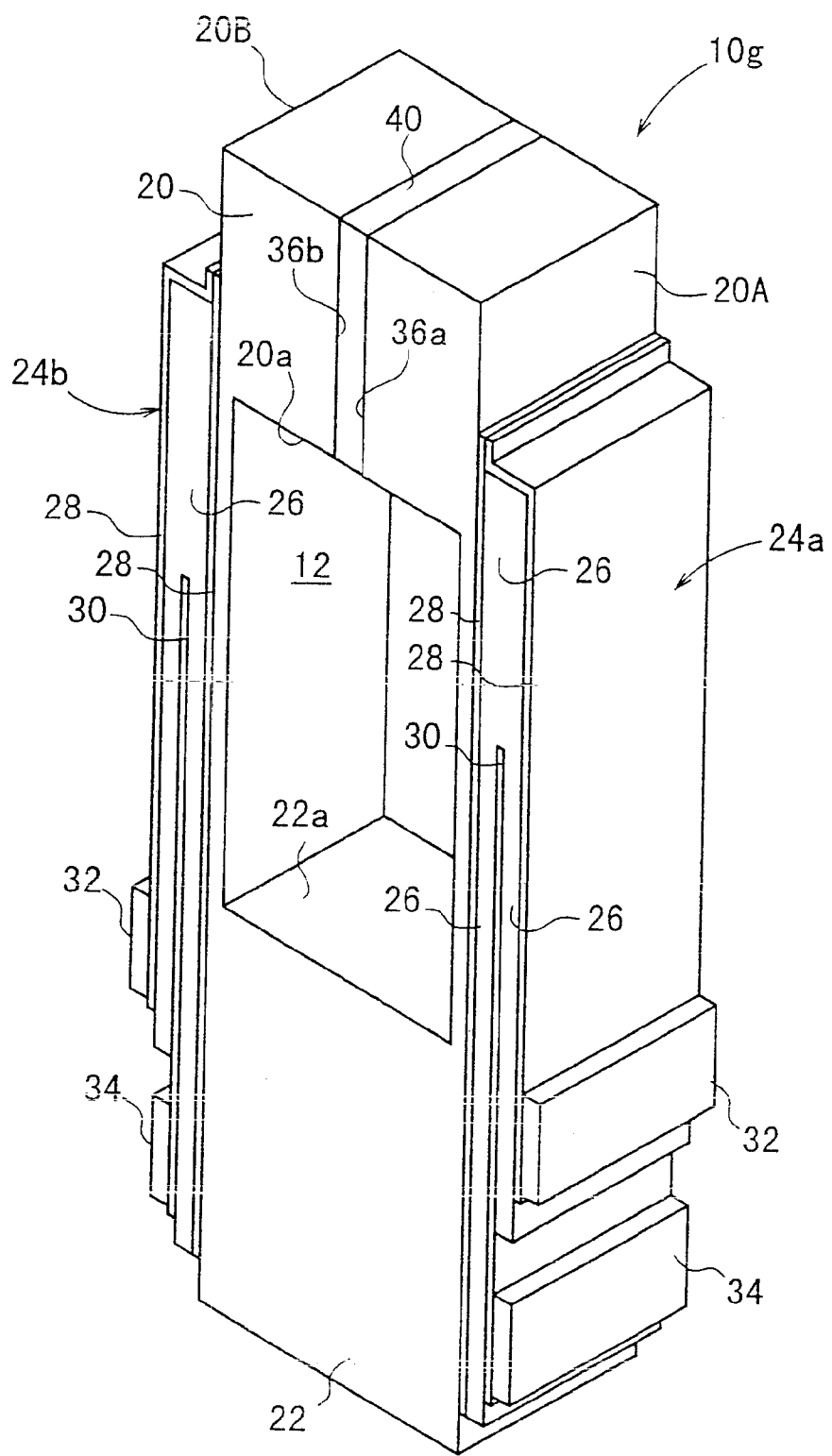
FIG. 9 shows a perspective view illustrating a seventh modified embodiment of the piezoelectric/electrostrictive device according to the embodiment of the present invention.

Alternatively, as in a piezoelectric/electrostrictive device 10*g* according to a seventh modified embodiment shown in FIG. 9, it is also preferable that the piezoelectric/electrostrictive layer 26 has the two-layered structure to provide the piezoelectric/electrostrictive element 24*a*, 24*b* having the multiple stage structure which is formed such that the first electrode 28 is located on the lower surface of the first layer (side surface of the thin plate section 16*a*, 16*b*) and on the upper surface of the second layer, and the second electrode 30 is located on the upper surface of the first layer. In this embodiment, a member 40, which is different from the movable section 20, is filled between the end surfaces 36*a*, 36*b* of the movable section 20.

The multiple stage structure of the piezoelectric/electrostrictive element 24*a*, 24*b* as described above increases the force generated by the piezoelectric/electrostrictive element 24*a*, 24*b*, and thus it is possible to obtain a large displacement. Further, the rigidity of the piezoelectric/electrostrictive device 10 itself is increased, and thus it is possible to realize a high resonance frequency. Consequently, it is possible to achieve the high speed displacement action with ease.

When the number of stages is increased, it is possible to increase the driving force. However, the electric power consumption is also increased in accordance therewith. Therefore, when the device is practically produced and used, for example, it is preferable that the number of stages is appropriately determined depending on the way of use and the state of use. In the case of the piezoelectric/electrostrictive device 10 according to this embodiment, even when the driving force is increased by providing the multiple stage structure of the piezoelectric/electrostrictive element 24*a*, 24*b*, the width of the thin plate section 16*a*, 16*b* (distance in the Y axis direction) is basically unchanged. Therefore, the device is extremely preferred to provide, for example, an actuator for the purpose of the ringing control and the positioning of the magnetic head for a hard disk to be used in an extremely narrow gap.

Figure 10:
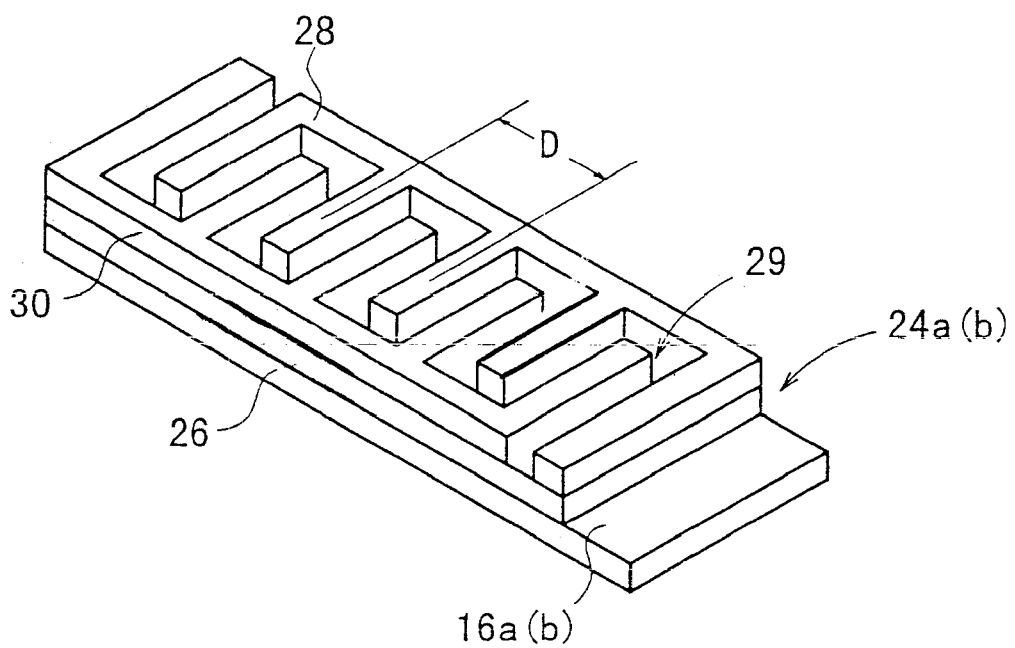
FIG. 10 shows, with partial omission, another embodiment of the piezoelectric/electrostrictive element.

The piezoelectric/electrostrictive element 24*a*, 24*b* is illustrative of the case of the so-called sandwich structure in which the piezoelectric/electrostrictive layer 26 is interposed between the pair of electrodes 28, 30. Alternatively, as shown in FIG. 10, a pair of comb-shaped electrodes 28, 30 may be formed on the first principal surface of the piezoelectric/electrostrictive layer 26 which is formed on at least the side surface of the thin plate sections 16a, 16b. Further alternatively, as shown in FIG. 11, a pair of comb-shaped electrodes 28, 30 are formed and embedded in the piezoelectric/electrostrictive layer 26 formed on at least the side surface of the thin plate section 16a, 16b.

The structure shown in FIG. 10 is advantageous in that it is possible to decrease the electric power consumption needed to drive the piezoelectric/electrostrictive element. The structure shown in FIG. 11 is advantageous because it allows for a large displacement. For example, it is possible to effectively utilize the inverse piezoelectric effect in the direction of the electric field having a large generated force and strain.

Specifically, the piezoelectric/electrostrictive element 24a, 24b shown in FIG. 10 comprises a pair of electrodes 28, 30 having a comb-shaped structure formed on the first principal surface of the piezoelectric/electrostrictive layer 26. In this structure, the first electrode 28 and the second electrode 30 are mutually opposed to one another in an alternate manner with a gap 29 having a constant width interposed therebetween. FIG. 10 is illustrative of the case in which the pair of electrodes 28, 30 are formed on the first principal surface of the piezoelectric/electrostrictive layer 26. Alternatively, the pair of electrodes 28, 30 may be formed between the thin plate section 16a, 16b and the piezoelectric/electrostrictive layer 26. Further alternatively, the pair of comb-shaped electrodes 28, 30 may be formed on the first principal surface of the piezoelectric/electrostrictive layer 26 and between the thin plate section 16a, 16b and the piezoelectric/electrostrictive layer 26 respectively. On the other hand, in the piezoelectric/electrostrictive element 24a, 24b shown in FIG. 11, the pair of electrodes 28, 30 having the comb-shaped structure are formed so that they are embedded in the piezoelectric/electrostrictive layer 26. In this structure, the first electrode 28 and the second electrode 30 are mutually opposed to one another in an alternate manner with a gap 29 having a constant width interposed therebetween.

Figure 11:
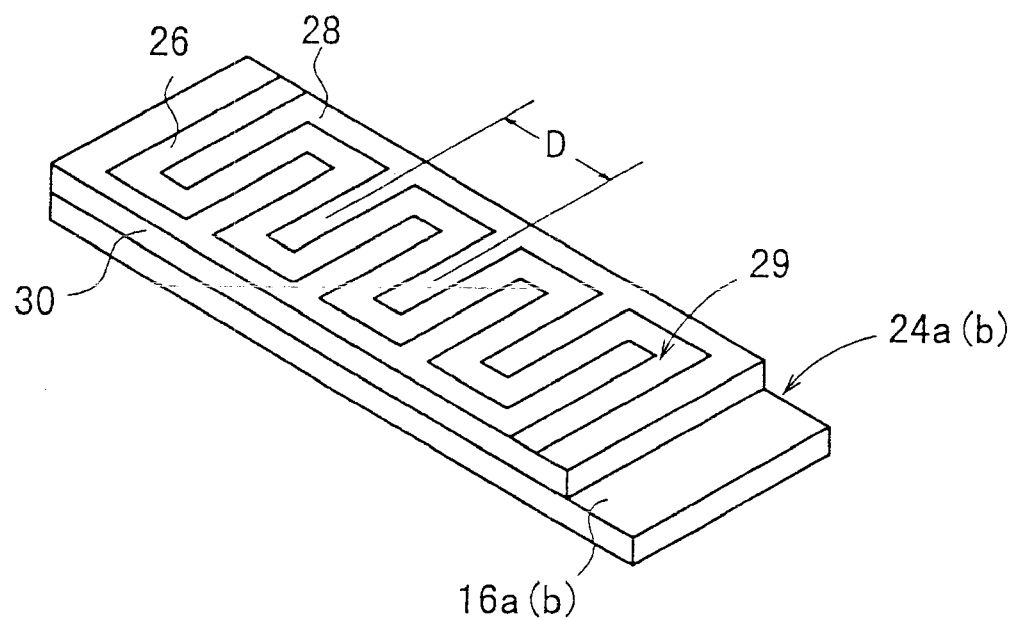
FIG. 11 shows, with partial omission, still another embodiment of the piezoelectric/electrostrictive element.

The piezoelectric/electrostrictive elements 24a, 24b as shown in FIGS. 10 and 11 can be preferably used for the piezoelectric/electrostrictive device 10 according to the embodiment of the present invention as well. When the pair of comb-shaped electrodes 28, 30 are used as in the piezoelectric/electrostrictive elements 24a, 24b shown in FIGS. 10 and 11, the displacement of the piezoelectric/electrostrictive element 24a, 24b can be increased by decreasing the pitch D of the comb teeth of the respective electrodes 28, 30.

The operation of the piezoelectric/electrostrictive device 10 according to the embodiment of the present invention will now be explained. At first, for example, when the two piezoelectric/electrostrictive elements 24a, 24b are in the natural state, namely when both of the piezoelectric/electrostrictive elements 24a, 24b do not make the displacement action, then the major axis m of the piezoelectric/electrostrictive device 10 (major axis of the fixation section, i.e., see FIG. 12) is substantially coincident with the central axis n of the movable section 20 as shown in FIG. 12.

Figure 13A:
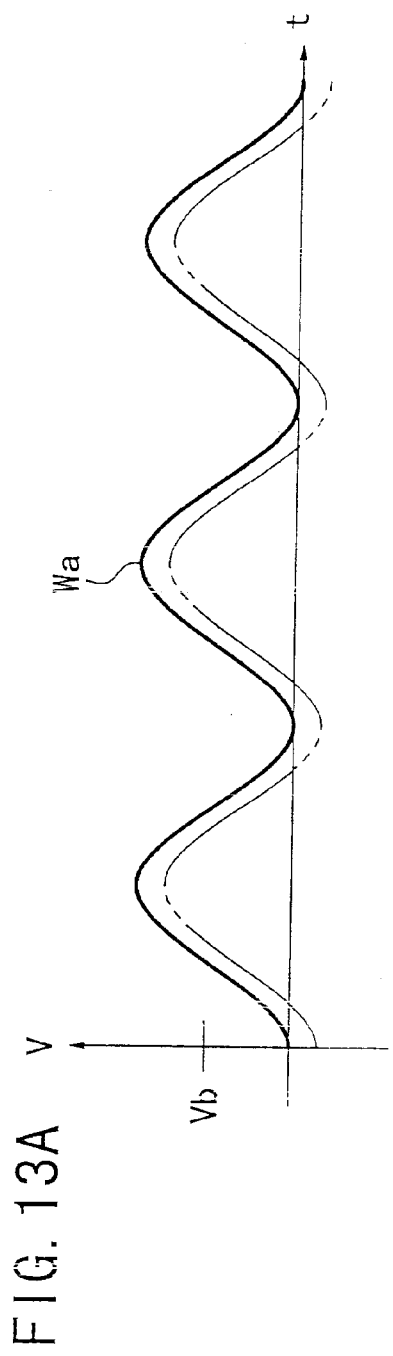
FIG. 13A shows a waveform illustrating a voltage waveform to be applied to the first piezoelectric/electrostrictive element.
Figure 13B:
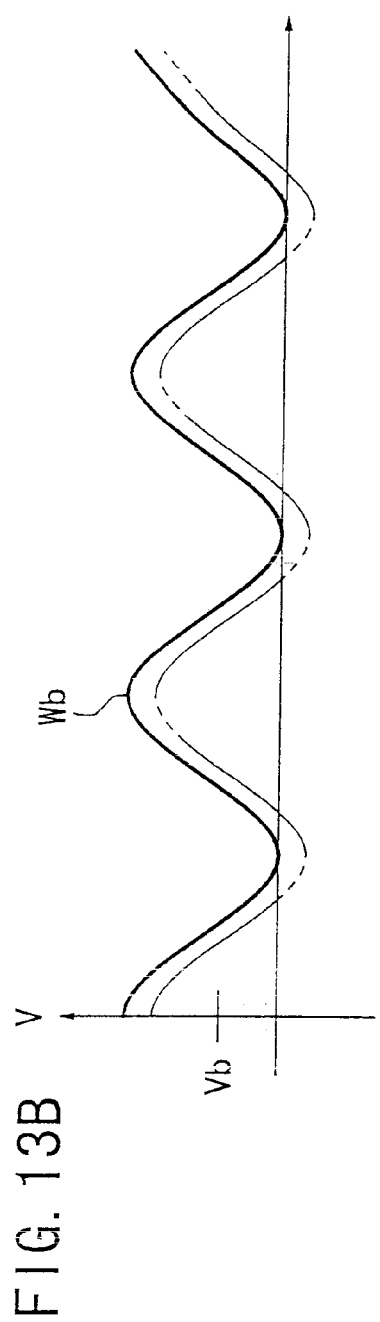
FIG. 13B shows a waveform illustrating a voltage waveform to be applied to the second piezoelectric/electrostrictive element.

Starting from this state, for example, a sine wave Wa, which has a predetermined bias electric potential Vb, is applied to the pair of electrodes 28, 30 of the first piezoelectric/electrostrictive element 24a as shown in a waveform figure shown in FIG. 13A, while a sine wave Wb, which has a phase different from that of the sine wave Wa by about 180°, is applied to the pair of electrodes 28, 30 of the second piezoelectric/electrostrictive element 24b as shown in FIG. 13B.

Figure 14:
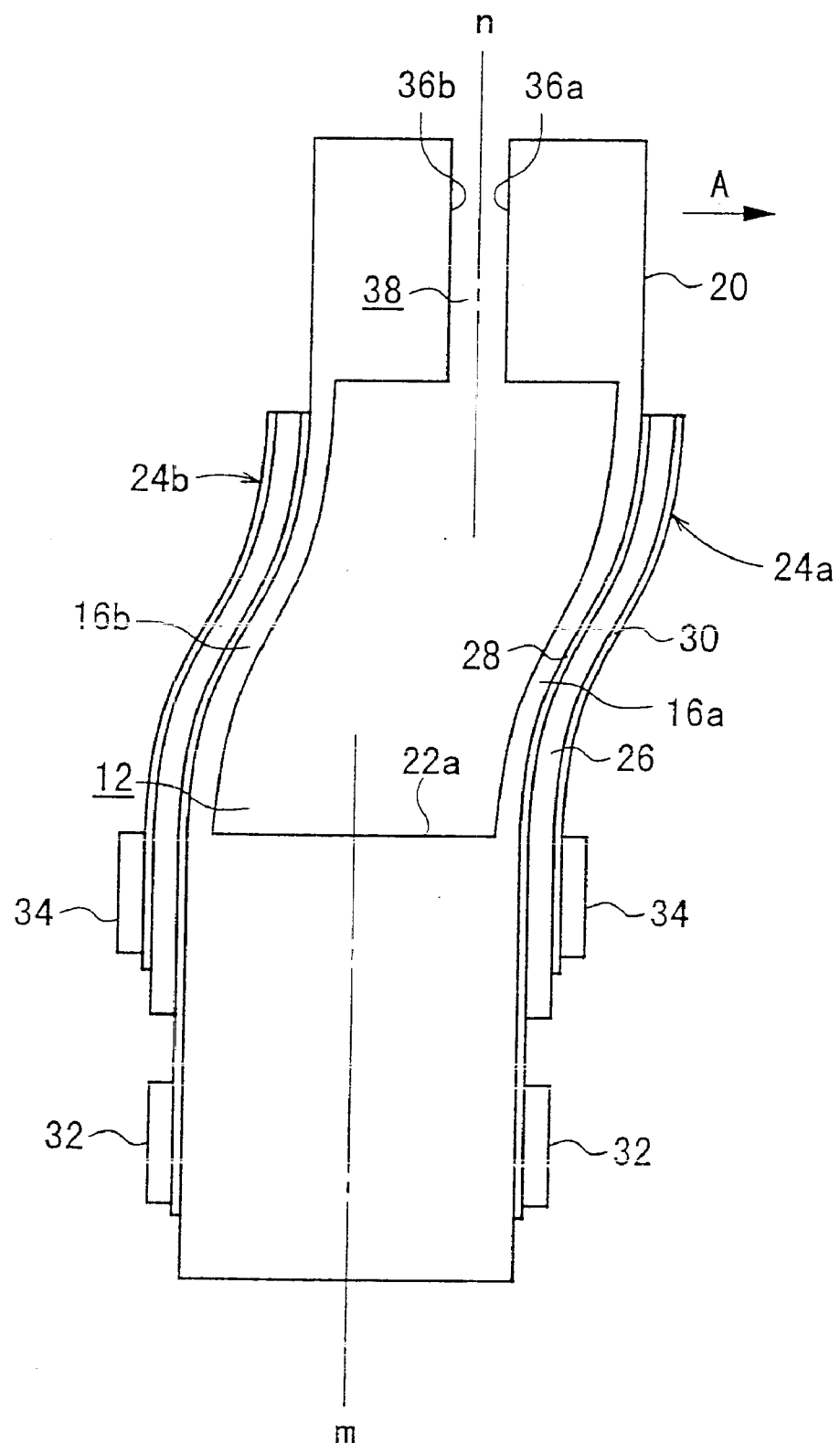
FIG. 14 illustrates a situation in which the piezoelectric/electrostrictive element makes the displacement action in the piezoelectric/electrostrictive device according to the embodiment of the present invention.

The piezoelectric/electrostrictive layer 26 of the first piezoelectric/electrostrictive element 24a makes the contraction displacement in the direction of the first principal surface at a stage at which, for example, a voltage having a maximum value is applied to the pair of electrodes 28, 30 of the first piezoelectric/electrostrictive element 24a. Accordingly, as shown in FIG. 14, for example, the stress is generated for the first thin plate section 16a to bend the thin plate section 16a, for example, in the rightward direction as shown by the arrow A. Therefore, the first thin plate section 16a is bent in the rightward direction. At this time, a state is given, in which no voltage is applied to the pair of electrodes 28, 30 of the second piezoelectric/electrostrictive element 24b. Therefore, the second thin plate section 16b follows the bending of the first thin plate section 16a, and it is bent in the rightward direction. As a result, the movable section 20 is displaced, for example, in the rightward direction with respect to the major axis m of the piezoelectric/electrostrictive device 10. The displacement amount is changed depending on the maximum value of the voltage applied to each of the piezoelectric/electrostrictive elements 24a, 24b. For example, the larger the maximum value is, the larger the displacement amount is.

Especially, when a material having a coercive electric field is applied as the constitutive material for the piezoelectric/electrostrictive layer 26, it is also preferable that the bias electric potential is adjusted so that the level of the minimum value is a slightly negative level as depicted by waveforms indicated by dashed lines in FIGS. 13A and 13B. In this case, for example, the stress, which is in the same direction as the bending direction of the first thin plate section 16a, is generated in the second thin plate section 16b by driving the piezoelectric/electrostrictive element (for example, the second piezoelectric/electrostrictive element 24b) to which the negative level is applied. Accordingly, it is possible to further increase the displacement amount of the movable section 20. In other words, when the waveforms indicated by the dashed lines in FIGS. 13A and 13B are used, the device is allowed to have such a function that the piezoelectric/electrostrictive element 24b or 24a, to which the negative level is applied, supports the piezoelectric/electrostrictive element 24a or 24b which principally makes the displacement action.

In the case of the piezoelectric/electrostrictive device 10f shown in FIG. 8, the voltage (see the sine waveform Wa) shown in FIG. 13 is applied, for example, to the piezoelectric/electrostrictive element 24a1 and the piezoelectric/electrostrictive element 24b2 which are arranged on the diagonal line, and the voltage (see the sine waveform Wb) shown in FIG. 13B is applied to the other piezoelectric/electrostrictive element 24a2 and the other piezoelectric/electrostrictive element 24b1.

As described above, in the piezoelectric/electrostrictive device 10 according to the embodiment of the present invention, the minute displacement of the piezoelectric/electrostrictive element 24a, 24b is amplified into a large displacement action by utilizing the bending of the thin plate sections 16a, 16b, and it is transmitted to the movable section 20. Accordingly, it is possible to greatly displace the movable section 20 with respect to the major axis m of the piezoelectric/electrostrictive device 10.

Especially, in this embodiment, the movable section 20 is provided with mutually opposing end surfaces 36a, 36b. In this arrangement, a gap 38 is provided between the mutually opposing end surfaces 36a, 36b, or the member 40 (see FIG. 9), which is lighter than the constitutive member of the movable section 20, is allowed to intervene between the mutually opposing end surfaces 36a, 36b. Accordingly, it is possible to effectively realize a light weight of the movable section 20. Thus, it is possible to increase the resonance frequency without decreasing the displacement amount of the movable section 20.

The frequency herein indicates the frequency of the voltage waveform obtained when the movable section 20 is displaced rightwardly and leftwardly by alternately switching the voltage applied to the pair of electrodes 28, 30. The resonance frequency indicates the maximum frequency at which the displacement action of the movable section 20 can follow in a predetermined vibration mode.

In the piezoelectric/electrostrictive device 10 according to this embodiment, the movable section 20, the thin plate sections 16a, 16b, and the fixation section 22 are integrated into one unit. It is unnecessary that all of the parts are formed with the piezoelectric/electrostrictive material which is a fragile material having a relatively heavy weight. Therefore, the device has the following advantages. That is, the device has a high mechanical strength, and it is excellent in handling performance, shock resistance, and moisture resistance.

Further, the operation of the device is scarcely affected by harmful vibration (for example, noise vibration and remaining vibration during high speed operation).

Further, in this embodiment, when the gap 38 is formed between the mutually opposing end surfaces 36a, 36b, a part 20A (see FIG. 9) of the movable section 20 including the first end surface 36a and another part 20B of the movable section 20 including the second end surface 36b are easily bent, resulting in strong resistance to the deformation. Accordingly, the piezoelectric/electrostrictive device 10 is excellent in handling performance.

The surface area of the movable section 20 or the fixation section 22 is increased owing to the presence of the mutually opposing end surfaces 36a, 36b. Therefore, as shown in FIG. 1, when the movable section 20 has the mutually opposing end surfaces 36a, 36b, the attachment area can be increased when another part is attached to the movable section 20. Thus, it is possible to improve the attachment performance for the attached part. It is now assumed that the part is secured, for example, with an adhesive or the like. In this case, the adhesive is fully distributed to the end surfaces 36a, 36b as well as to the first principal surface (attachment surface for the part) of the movable section 20. Therefore, it is possible to dissolve, for example, shortage of application of the adhesive. Thus, it is possible to reliably secure the part.

Figure 15:
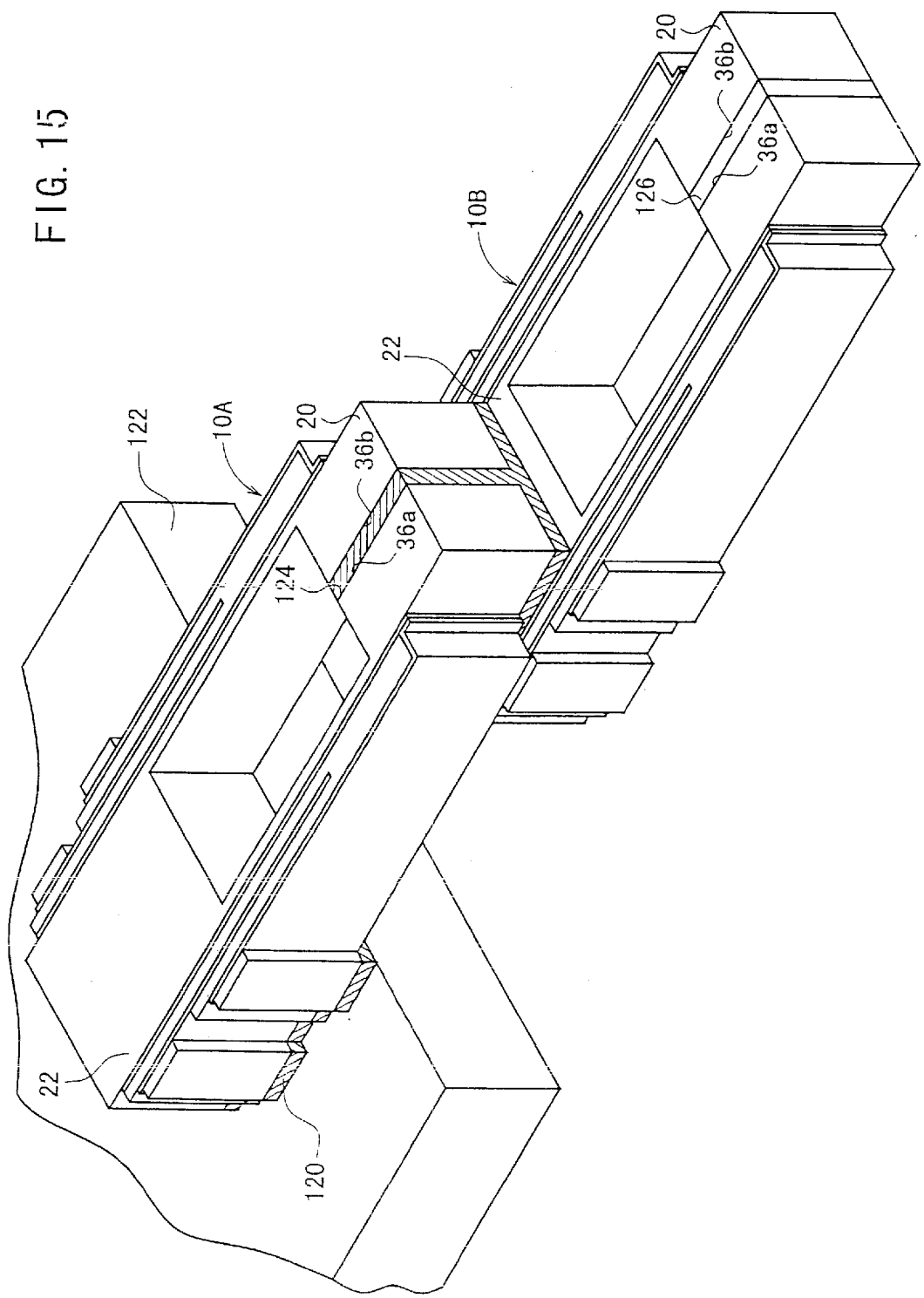
FIG. 15 shows a perspective view illustrating an arrangement in which a second piezoelectric/electrostrictive device is secured to a movable section of a first piezoelectric/electrostrictive device.

As an example of such an arrangement, FIG. 15 is illustrative of a case in which another piezoelectric/electrostrictive device according to the embodiment of the present invention (second piezoelectric/electrostrictive device 10B) is secured to the movable section 20 of the piezoelectric/electrostrictive device according to the embodiment of the present invention (first piezoelectric/electrostrictive device 10A).

The first piezoelectric/electrostrictive device 10A has its fixation section 22 which is secured to the surface of a base plate 122 by the aid of an adhesive 120. The fixation section 22 of the second piezoelectric/electrostrictive device 10B is secured to the movable section 20 of the first piezoelectric/electrostrictive device 10A by the aid of an adhesive 124.

That is, in this arrangement, the two piezoelectric/electrostrictive devices 10A, 10B are arranged in series. A member 126 having a light weight, which is different from the movable section, is allowed to intervene between the mutually opposing end surfaces of the movable section of the second piezoelectric/electrostrictive device.

In this case, the adhesive 124 for gluing the second piezoelectric/electrostrictive device 10B is fully distributed up to the space between the end surfaces 36a, 36b of the movable section 20 of the first piezoelectric/electrostrictive device 10A. Accordingly, the second piezoelectric/electrostrictive device 10B is tightly secured to the first piezoelectric/electrostrictive device 10A. When the piezoelectric/electrostrictive device 10B is glued as described above, the light weight member (adhesive 124 in this case), which is different from the movable section 20, is allowed to intervene between the end surfaces 36a, 36b simultaneously with the adhesion. Therefore, this arrangement is advantageous in that the production step can be simplified.

On the other hand, as shown in FIG. 3, when the fixation section 22 has the mutually opposing end surfaces 36a, 36b, it is possible to tightly fix the piezoelectric/electrostrictive device 10 according to this embodiment to a predetermined fixation portion, in addition to the effect obtained when the movable section 20 has the mutually opposing end surfaces 36a, 36b as described above. Thus, it is possible to improve the reliability.

In the first embodiment, the piezoelectric/electrostrictive element 24a, 24b is constructed to have the piezoelectric/electrostrictive layer 26 and the pair of electrodes 28, 30 formed on the both sides of the piezoelectric/electrostrictive layer 26. The first electrode 28 of the pair of electrodes 28, 30 is formed on at least the outer surface of the thin plate section 16a, 16b. Therefore, the vibration caused by the piezoelectric/electrostrictive element 24a, 24b can be efficiently transmitted to the movable section 20 via the thin plate section 16a, 16b. Thus, it is possible to improve the response performance.

In the first embodiment, the portion (substantial driving portion 18, see FIG. 1), at which the pair of electrodes 28, 30 are overlapped with each other with the piezoelectric/electrostrictive layer 26 interposed therebetween, is continuously formed over the range from the part of the fixation section 22 to the part of the thin plate section 16a, 16b. If the substantial driving portion 18 is formed to further extend over a part of the movable section 20, then it is feared that the displacement action of the movable section 20 is restricted by the substantial driving portion 18, and it is impossible to obtain a large displacement. However, in this embodiment, the substantial driving portion 18 is formed such that it does not range over both of the movable section 20 and the fixation section 22. Therefore, it is possible to avoid the inconvenience of the restriction of the displacement action of the movable section 20, and it is possible to increase the displacement amount of the movable section 20.

On the other hand, when the piezoelectric/electrostrictive element 24a, 24b is formed on the part of the movable section 20, it is preferable that the substantial driving portion 18 is located over the range from the part of the movable section 20 to the part of the thin plate section 16a, 16b, because of the following reason. That is, if the substantial driving portion 18 is formed to extend up to a part of the fixation section 22, the displacement action of the movable section 20 is restricted as described above.

Next, explanation will be made for preferred illustrative constructions of the piezoelectric/electrostrictive device 10 according to the embodiment of the present invention.

At first, with reference to FIG. 1, in order to ensure the displacement action of the movable section 20, it is preferable that the distance g, by which the substantial driving portion 18 of the piezoelectric/electrostrictive element 24a, 24b is overlapped with the fixation section 22 or the movable section 20, is not less than ½ of the thickness d of the thin plate section 16a, 16b.

The device is constructed such that the ratio a/b between a distance (a) (distance in the X axis direction) between the inner walls of the thin plate sections 16a, 16b and a width (b) (width in the Y axis direction) of the thin plate section 16a, 16b is 0.5 to 20. The ratio a/b is preferably 1 to 10 and more preferably 2 to 8. The value of the ratio a/b is prescribed on the basis of the discovery that as the amount of displacement of the movable section 20 is increased, it is possible to dominantly obtain the displacement in the X-Z plane.

On the other hand, it is desirable that the ratio e/a between the length (e) (length in the Z axis direction) of the thin plate section 20 and the distance (a) between the inner walls of the thin plate sections 16a, 16b is preferably 0.5 to 10 and more preferably 0.7 to 5. The value of the ratio e/a is prescribed on the basis of the discovery that the displacement amount of the movable section 20 can be increased, and the displacement action can be performed at a high resonance frequency (high response speed can be achieved).

Therefore, in order to suppress the swaying displacement in the Y axis direction or the vibration of the piezoelectric/electrostrictive device 10 according to this embodiment and provide the structure in which the high speed response performance is excellent and the large displacement is simultaneously obtained at a relatively low voltage, it is preferable that the ratio a/b is 0.5 to 20 and the ratio e/a is 0.5 to 10, and it is more preferable that the ratio a/b is 1 to 10 and the ratio e/a is 0.7 to 5.

Further, it is preferable that the hole 12 is filled with a gel material, for example, silicon-gel. Usually, the displacement action of the movable section 20 is restricted by the presence of such a filler material. However, in the first embodiment, it is intended to realize a light weight brought about by the formation of the end surfaces 36a, 36b on the movable section 20 and increase the displacement amount of the movable section 20. Therefore, the restriction of the displacement action of the movable section 20 due to the filler material is counteracted. Accordingly, it is possible to realize the effect owing to the presence of the filler material, namely the realization of the high resonance frequency and the maintenance of the rigidity.

It is preferable that the length (f) (length in the Z axis direction) of the movable section 20 is short, because of the following reason. That is, it is possible to realize a light weight and increase the resonance frequency by shortening the length. However, in order to ensure the rigidity of the movable section 20 in the X axis direction and obtain its reliable displacement, it is desirable that the radio f/d with respect to the thickness d of the thin plate section 16a, 16b is not less than 3 and preferably not less than 10.

The actual size of each component is determined considering, for example, the joining area for attaching an attachment part to the movable section 20, the joining area for attaching the fixation section 22 to another member, the joining area for attaching the electrode terminal or the like, and the strength, the durability, the necessary displacement amount, the resonance frequency, and the driving voltage of the entire piezoelectric/electrostrictive device 10.

Specifically, for example, the distance (a) between the inner walls of the thin plate sections 16a, 16b is preferably 100 μm to 2000 μm and more preferably 200 μm to 1000 μm. The width (b) of the thin plate section 16a, 16b is preferably 50 μm to 2000 μm and more preferably 100 μm to 500 μm. The thickness (d) of the thin plate section 16a, 16b is preferably 2 μm to 100 μm and more preferably 4 μm to 50 μm (which satisfies b>d in relation to the width (b) of the thin plate section 16a, 16b) in order to make it possible to effectively suppress the swaying displacement which is the displacement component in the Y axis direction.

The length (e) of the thin plate section 16a, 16b is preferably 200 μm to 3000 μm and more preferably 300 μm to 2000 μm. The length (f) of the movable section 20 is preferably 50 μm to 2000 μm and more preferably 100 μm to The arrangement as described above exhibits such an extremely excellent effect that the displacement in the Y axis direction does not exceed 10% with respect to the displacement in the X axis direction. The device can be driven at a low voltage by appropriately making adjustments to its size, and consequently, it is possible to suppress the displacement component in the Y axis direction to be not more than 5%. In other words, the movable section 20 is displaced in one axis direction, i.e., substantially in the X axis direction. Further, the high speed response is excellent, and it is possible to obtain a large displacement at a relatively low voltage.

In the piezoelectric/electrostrictive device 10, the shape of the device is unlike that of conventional devices, i.e., not a plate-shaped configuration. Each of the movable section 20 and the fixation section 22 has a rectangular parallelepiped-shaped configuration. The pair of thin plate sections 16a, 16b are provided so that the side surface of the movable section 20 is continuous to the side surface of the fixation section 22. Therefore, it is possible to selectively increase the rigidity of piezoelectric/electrostrictive device 10 in the Y axis direction.

That is, in the piezoelectric/electrostrictive device 10, it is possible to selectively generate only the operation of the movable section 20 in the plane (XZ plane). It is possible to suppress the operation of the movable section 20 in the YZ plane (operation in the so-called swaying direction).

Next, explanation will be made for the respective constitutive components of the piezoelectric/electrostrictive device 10 according to the embodiment of the present invention.

As described above, the movable section 20 is the portion which is operated on the basis of the driving amount of the thin plate section 16a, 16b, and a variety of members are attached thereto depending on the purpose of use of the piezoelectric/electrostrictive device 10. For example, when the piezoelectric/electrostrictive device 10 is used as a displacement element, a shield plate for an optical shutter or the like is attached thereto. Especially, when the piezoelectric/electrostrictive device 10 is used for the mechanism for positioning a magnetic head of a hard disk drive or for suppressing a ringing, a member required to be positioned is attached thereto, including, for example, the magnetic head, a slider provided with the magnetic head, and a suspension provided with the slider.

As described above, the fixation section 22 is the portion for supporting the thin plate sections 16a, 16b and the movable section 20. For example, when the fixation section 22 is utilized to position the magnetic head of the hard disk drive, the entire piezoelectric/electrostrictive device 10 is fixed by supporting and securing the fixation section 22, for example, to a carriage arm attached to a VCM (voice coil motor) or a fixation plate or a suspension attached to the carriage arm. As shown in FIG. 1, the terminals 32, 34 for driving the piezoelectric/electrostrictive elements 24a, 24b and other members are arranged on the fixation section 22 in some cases.

The material for constructing the movable section 20 and the fixation section 22 is not specifically limited provided that it has rigidity. However, it is possible to preferably use ceramics to which the ceramic green sheet-stacking method is applicable as described later on. Specifically, the material includes, for example, materials containing a major component of zirconia represented by stabilized zirconia and partially stabilized zirconia, alumina, magnesia, silicon nitride, aluminum nitride, and titanium oxide, as well as materials containing a major component of a mixture of them. However, in view of its high mechanical strength and its high toughness, it is preferable to use a material containing a major component of zirconia, especially stabilized zirconia and a material containing a major component of partially stabilized zirconia. The metal material is not limited provided that it has rigidity. However, the metal material includes, for example, stainless steel and nickel.

As described above, the thin plate section 16a, 16b is the portion which is driven in accordance with the displacement of the piezoelectric/electrostrictive element 24a, 24b. The thin plate section 16a, 16b is the thin plate-shaped member having flexibility, and it functions to amplify the stretching displacement of the piezoelectric/electrostrictive element 24a, 24b arranged on its surface (i.e., the bending displacement) and transmit that displacement to the movable section 20. Therefore, the shape or the material of the thin plate section 16a, 16b should provide the flexibility and mechanical strength to such a degree that it is not broken by the bending displacement. It is possible to make appropriate selection considering the response performance and the operability of the movable section 20.

It is preferable that the thickness (d) of the thin plate section 16a, 16b is preferably about 2 μm to 100 μm. It is preferable that the combined thickness of the thin plate section 16a, 16b and the piezoelectric/electrostrictive element 24a, 24b is 7 μm to 500 μm. It is preferable that the thickness of the electrode 28, 30 is 0.1 to 50 μm, and the thickness of the piezoelectric/electrostrictive layer 26 is 3 to 300 μm. The width (b) of the thin plate section 16a, 16b is preferably 50 μm to 2000 μm.

Ceramics, which is similarly used for the movable section 20 and the fixation section 22, can be preferably used as the material for constructing the thin plate section 16a, 16b. A material containing a major component of zirconia, especially stabilized zirconia and a material containing a major component of partially stabilized zirconia are most preferably used, because the mechanical strength is large even in the case of a thin wall thickness, the toughness is high, and the reactivity with the piezoelectric/electrostrictive layer and the electrode material is small.

When the thin plate section 16a, 16b is made of a metal material, the metal material should have flexibility and be capable of bending displacement as described above. However, preferably, it is desirable that the thin plate section 16a, 16b is made of an iron-based material such as various stainless steel materials and various spring steel materials. Alternatively, it is desirable that the thin plate section 16a, 16b is made of a non-ferrous material such as beryllium copper, phosphor bronze, nickel, and nickel-iron alloy.

Those which are stabilized or partially stabilized as follows are preferably used as stabilized zirconia or partially stabilized zirconia as described above. That is, the compound to be used for stabilizing or partially stabilizing zirconia includes yttrium oxide, ytterbium oxide, cerium oxide, calcium oxide, and magnesium oxide. When at least one compound of them is added and contained, zirconia is partially or fully stabilized. However, as for the stabilization, the objective zirconia can be stabilized not only by adding one type of the compound but also by adding a combination of the above compounds.

The amount of addition of each of the compounds is desirably as follows. That is, yttrium oxide or ytterbium oxide is added by 1 to 30 mole %, preferably 1.5 to 10 mole %. Cerium oxide is added by 6 to 50 mole %, preferably 8 to 20 mole %. Calcium oxide or magnesium oxide is added by 5 to 40 mole %, preferably 5 to 20 mole %. Especially, it is preferable to use yttrium oxide as a stabilizer. In this case, yttrium oxide is desirably added by 1.5 to 10 mole %, more preferably 2 to 4 mole %. For example, alumina, silica, or transition metal oxide may be added as an additive of sintering aid or the like in a range of 0.05 to 20% by weight. However, when the sintering integration based on the film formation method is adopted as a technique for forming the piezoelectric/electrostrictive element 24a, 24b, it is also preferable to add, for example, alumina, magnesia, and transition metal oxide as an additive.

In order to obtain the mechanical strength and the stable crystal phase, it is desirable that the average crystal grain size of zirconia is 0.05 to 3 μm, preferably 0.05 to 1 μm. As described above, ceramics can be used for the thin plate section 16a, 16b in the same manner as in the movable section 20 and the fixation section 22. Preferably, it is advantageous to construct the thin plate sections 16a, 16b with a substantially identical material in view of the reliability of the joined portion and the strength of the piezoelectric/electrostrictive device 10 in order to reduce any complicated procedure of the production.

The piezoelectric/electrostrictive element 24a, 24b has at least the piezoelectric/electrostrictive layer 26 and the pair of electrodes 28, 30 for applying the electric field to the piezoelectric/electrostrictive layer 26. It is possible to use, for example, piezoelectric/electrostrictive elements of the unimorph type and the bimorph type. However, those of the unimorph type are suitable for the piezoelectric/electrostrictive device 10 as described above, because they are excellent in stability of the generated displacement amount and they are advantageous to realize a light weight.

For example, as shown in FIG. 1, it is possible to preferably use, for example, the piezoelectric/electrostrictive element comprising the first electrode 28, the piezoelectric/electrostrictive layer 26, and the second electrode 30 which are stacked in the layered configuration. Additionally, it is also preferable to provide the multiple stage structure as shown in FIGS. 5 to 9.

As shown in FIG. 1, the piezoelectric/electrostrictive element 24a, 24b is preferably formed on the outer surface side of the piezoelectric/electrostrictive device 10 in view of the fact that the thin plate sections 16a, 16b can be driven to a greater extent. However, the piezoelectric/electrostrictive element 24a, 24b may be formed on the inner surface side of the piezoelectric/electrostrictive device 10, i.e., on the inner wall surface of the hole 12 depending on, for example, the form of use. Alternatively, the piezoelectric/electrostrictive elements 24a, 24b may be formed both on the outer surface side and on the inner surface side.

Piezoelectric ceramics is preferably used for the piezoelectric/electrostrictive layer 26. However, it is also possible to use electrostrictive ceramics, ferroelectric ceramics, or anti-ferroelectric ceramics. However, when the piezoelectric/electrostrictive device 10 is used, for example, to position the magnetic head of a hard disk drive, it is important to provide the linearity concerning the displacement amount of the movable section 20 and the driving voltage or the output voltage. Therefore, it is preferable to use a material having a small strain hysteresis. It is preferable to use a material having a coercive electric field of not more than 10 kV/mm.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

Especially, a material containing a major component of lead zirconate, lead titanate, and lead magnesium niobate, or a material containing a major component of sodium bismuth titanate is preferably used, in order to obtain the product having a stable composition with a high electromechanical coupling coefficient and a piezoelectric constant and with small reactivity with the thin plate sections 16a, 16b (ceramics) during the sintering of the piezoelectric/electrostrictive layer 26.

It is also preferable to use ceramics obtained by adding, to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum singly or in mixture.

For example, when lanthanum and/or strontium is contained in the major components of lead zirconate, lead titanate, and lead magnesium niobate, an advantage is obtained in some cases, for example, in such a way that the coercive electric field and the piezoelectric characteristic can be adjusted.

It is desirable to avoid the addition of a material such as silica which tends to form glass, because of the following reason. That is, the material such as silica tends to react with the piezoelectric/electrostrictive material during the heat treatment for the piezoelectric/electrostrictive layer. As a result, the composition is varied, and the piezoelectric characteristic is deteriorated.

On the other hand, it is preferable that the piezoelectric/electrostrictive element 24a, 24b and the pair of electrodes 28, 30 are made of metal which is solid at room temperature and which is excellent in conductivity. For example, it is possible to use a metal substance or an alloy thereof, for example, aluminum, titanium, chromium, iron, cobalt, nickel, copper, zinc, niobium, molybdenum, ruthenium, palladium, rhodium, silver, stannum, tantalum, tungsten, iridium, platinum, gold, and lead. It is also preferable to use a cermet material obtained by dispersing, in the metal described above, the same material as that of the piezoelectric/electrostrictive layer 26 or the thin plate section 16a, 16b.

The material for the electrodes 28, 30 of the piezoelectric/electrostrictive element 24a, 24b is selected and determined depending on the method for forming the piezoelectric/electrostrictive layer 26. For example, when the piezoelectric/electrostrictive layer 26 is formed by sintering on the first electrode 28 after the first electrode 28 is formed on the thin plate section 16a, 16b, it is necessary for the first electrode 28 to use a high melting point metal such as platinum, palladium, platinum-palladium alloy, and silver-palladium alloy which does not change at the sintering temperature for the piezoelectric/electrostrictive layer 26. However, the electrode formation can be performed at a low temperature for the second electrode 30 which is formed on the piezoelectric/electrostrictive layer 26 after forming the piezoelectric/electrostrictive layer 26. Therefore, it is possible for the second electrode 30 to use a low melting point metal such as aluminum, gold, and silver.

The thickness of the electrodes 28, 30 also serves as a factor to considerably decrease the displacement of the piezoelectric/electrostrictive elements 24a, 24b. Therefore, it is preferable, especially for the electrode formed after the sintering of the piezoelectric/electrostrictive layer 26, to use organic metal paste capable of obtaining a dense and thinner film after the sintering, for example, a material such as gold resinate paste, platinum resinate paste, and silver resinate paste.

Next, explanation will be made with reference to FIGS. 15A to 27 for several methods for producing the piezoelectric/electrostrictive device 10 according to the embodiment of the present invention.

Ceramics is preferably used for the constitutive material for each of the members of the piezoelectric/electrostrictive device 10 according to the embodiment of the present invention. It is preferable that the constitutive elements of the piezoelectric/electrostrictive device 10 concerning the substrate 14 except for the piezoelectric/electrostrictive elements 24a, 24b, i.e., the thin plate sections 16a, 16b, the fixation section 22, and the movable section 20 are produced by using the ceramic green sheet-stacking method. On the other hand, it is preferable that the piezoelectric/electrostrictive elements 24a, 24b as well as the respective terminals 32, 34 are produced by using a film formation method, for example, for the thin film and the thick film.

According to the ceramic green sheet-stacking method in which the respective members of the substrate 14 of the piezoelectric/electrostrictive device 10 can be formed in an integrated manner, the time-dependent change of state scarcely occurs at the joined portions of the respective members. Therefore, this method provides a high reliability of the joined portion, and it is advantageous to ensure rigidity.

In the piezoelectric/electrostrictive device 10 according to this embodiment, the boundary portion (joined portion) between the thin plate section 16a, 16b and the fixation section 22 and the boundary portion (joined portion) between the thin plate section 16a, 16b and the movable section 20 function as supporting points for expressing the displacement. Therefore, the reliability of the joined portion is an important point which dominates the characteristics of the piezoelectric/electrostrictive device 10.

The production methods described below are excellent in reproducibility and formability. Therefore, it is possible to obtain the piezoelectric/electrostrictive device having a predetermined shape within a short period of time with good reproducibility.

A first production method for the piezoelectric/electrostrictive device 10 according to the embodiment of the present invention will be specifically explained below. The following definitions are now made. The stack, which is obtained by stacking the ceramic green sheets, is defined to be the ceramic green stack 58 (see, for example, FIG. 16B). The integrated matter, which is obtained by sintering the ceramic green stack 58, is defined to be the ceramic stack 60

Figure 17:
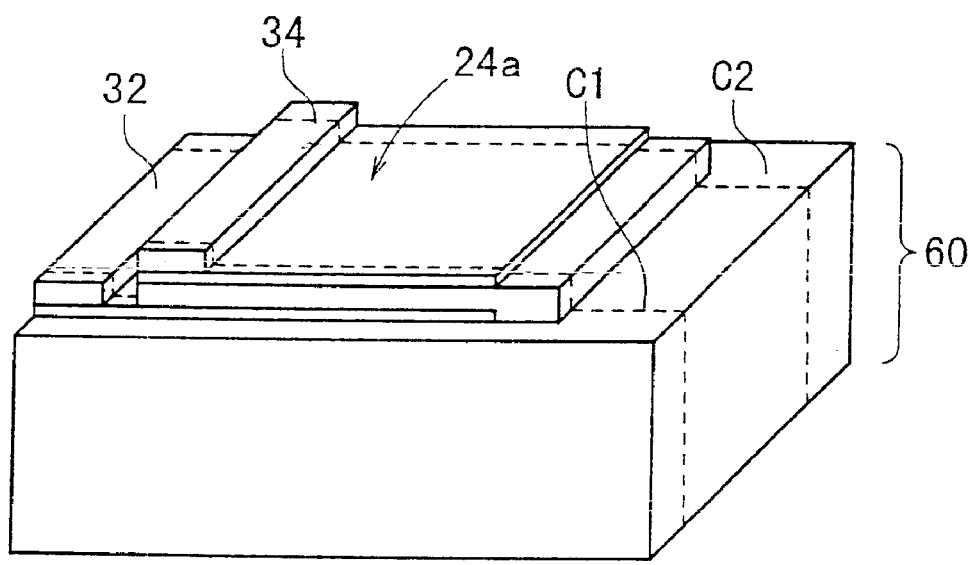
FIG. 17 illustrates a state in the first production method in which the ceramic green stack is converted into a sintered ceramic stack, and then a piezoelectric/electrostrictive element is formed on the ceramic stack.

(see, for example, FIG. 17). The integrated matter comprising the movable section 20, the thin plate sections 16a, 16b, and the fixation section 22, which is obtained by cutting off unnecessary portions from the ceramic stack 60, is defined to be the ceramic substrate 14C (see FIG. 18).

In the first production method, the ceramic stack 60 is subsequently cut into chip units to produce a large number of piezoelectric/electrostrictive devices 10. However, in order to simplify the explanation, description will be made principally for the case in which one individual of piezoelectric/electrostrictive device 10 is produced.

At first, for example, a binder, a solvent, a dispersing agent, and a plasticizer are added and mixed with a ceramic powder such as zirconia to prepare a slurry. The slurry is subjected to a foaming treatment, and then a ceramic green sheet having a predetermined thickness is prepared in accordance with, for example, the reverse roll coater method and the doctor blade method.

Subsequently, the ceramic green sheet is processed into those having various shapes as shown in FIG. 16A in accordance with, for example, the punching out based on a mold and laser machining methods to obtain a plurality of ceramic green sheets 50A to 50D, 52A, 52B for forming the substrate.

The ceramic green sheets 50A to 50D, 52A, 52B include a plurality (for example, four) of ceramic green sheets 50A to 50D each of which is formed with a window 54 for forming at least the hole 12 thereafter, and a plurality (for example, two) of ceramic green sheets 52A, 52B to be formed into the thin plate sections 16a, 16b thereafter. The numbers of ceramic green sheets referred to above are persistently by way of example.

After that, as shown in FIG. 16B, the ceramic green sheets 50A to 50D, 52A, 52B are stacked and secured under pressure so that the ceramic green sheets 50A to 50D are interposed between the ceramic green sheets 52A, 52B to form a ceramic green stack 58. Subsequently, the ceramic green stack 58 is sintered to obtain a ceramic stack 60 (see FIG. 17).

It is noted that there is no limitation for the number of pressure-securing process or processes and the sequence for the purpose of the stacking and integration into one unit. These factors can be appropriately determined depending on the structure, for example, so that the desired structure is obtained on the basis of, for example, the shape of the window 54 and the number of ceramic green sheets.

It is unnecessary that the shape of the window 54 is identical in all cases. The shape of the window 54 can be determined depending on the desired function. There is also no limitation for the number of ceramic green sheets and the thickness of each of the ceramic green sheets.

In the pressure-securing process, it is possible to further improve the stacking performance by applying heat. The stacking performance at the boundary of the ceramic green sheet can be improved by providing an auxiliary joining layer, for example, by applying and printing, onto the ceramic green sheet, a ceramic powder (it is preferable to use a composition which is the same as or similar to that of the ceramics used for the ceramic green sheet in order to ensure the reliability), or a paste or a slurry principally containing a binder. When the ceramic green sheets 52A, 52B are thin, it is preferable to handle them with a plastic film, especially with a polyethylene terephthalate film coated with a releasing agent based on silicone on the surface.

Subsequently, as shown in FIG. 17, the piezoelectric/electrostrictive elements 24a, 24b are formed respectively on both surfaces of the ceramic stack 60, i.e., on the surfaces corresponding to the surfaces at which the ceramic green sheets 52A, 52B are stacked. Those usable as the method for forming the piezoelectric/electrostrictive elements 24a, 24b include a thick film formation method such as a screen printing method, a dipping method, a brushing method, and an electrophoresis method, a thin film formation method such as an ion beam method, a sputtering method, a vacuum vapor deposition method, an ion plating method, a chemical vapor deposition method (CVD), and a plating method.

When the piezoelectric/electrostrictive elements 24a, 24b are formed by using the film formation method as described above, the piezoelectric/electrostrictive elements 24a, 24b and the thin plate sections 16a, 16b can be integrally joined and arranged without using any adhesive. It is possible to ensure reliability and reproducibility, while easily forming the stack.

In this case, it is preferable that the piezoelectric/electrostrictive elements 24a, 24b are formed by means of a thick film formation method, because of the following reason. That is, especially, when the piezoelectric/electrostrictive layer 26 is formed by using a thick film formation method, the film can be formed by using, for example, a paste, a slurry, a suspension, an emulsion, or a sol containing a major component of particles or powder of piezoelectric ceramics having an average grain size of 0.01 to 5 $\mu$m, preferably 0.05 to 3 $\mu$m. It is possible to obtain good piezoelectric/electrostrictive characteristics by sintering the formed film.

An electrophoresis method is advantageous in that the film can be formed at a high density with a high shape accuracy. A screen printing method is advantageous to simplify the production step, because it is possible to simultaneously perform the film formation and the pattern formation.

Explanation will be specifically made for the formation of the piezoelectric/electrostrictive elements 24a, 24b. At first, the ceramic green stack 58 is sintered and integrated into one unit at a temperature of 1200° C. to 1600° C. to obtain the ceramic stack 60. After that, the first electrodes 28 are printed and sintered at predetermined positions on both surfaces of the ceramic stack 60. Subsequently, the piezoelectric/electrostrictive layers 26 are printed and sintered. Then, the second electrodes 30 are printed and sintered to form the piezoelectric/electrostrictive elements 24a, 24b. After that, the terminals 32, 34 are printed and sintered in order to electrically connect the respective electrodes 28, 30 to the driving circuit.

In this process, when the materials are selected so that the sintering temperature for each of the members is lowered in accordance with the stacking sequence, then the material, which has been already sintered beforehand, is not sintered again at a certain sintering stage. For example, when platinum (Pt) is used for the first electrode 28, lead zirconate titanate (PZT) is used for the piezoelectric/electrostrictive layer 26, gold (Au) is used for the second electrode 30, and silver (Ag) is used for the terminals 32, 34. Thus, it is possible to avoid the occurrence of inconvenience such as peeling off and aggregation of the electrode material or the like.

When appropriate materials are selected, it is also possible to successively print the respective members of the piezoelectric/electrostrictive elements 24a, 24b and the terminals 32, 34, followed by the one time sintering. Further, it is also possible to provide, for example, the respective electrodes 30 at a low temperature after forming the piezoelectric/electrostrictive layers 26.

Alternatively, the respective members of the piezoelectric/electrostrictive elements 24a, 24b and the terminals 32, 34 may be formed by means of a thin film formation method such as a sputtering method and a vapor deposition method. In this case, it is not necessarily indispensable to perform a heat treatment.

When the piezoelectric/electrostrictive elements 24a, 24b are formed, it is also preferable that the piezoelectric/electrostrictive elements 24a, 24b are previously formed on both surfaces of the ceramic green stack 58, i.e., on the respective surfaces of the ceramic green sheets 52A, 52B, and the ceramic green stack 58 and the piezoelectric/electrostrictive elements 24a, 24b are simultaneously sintered. For example, the following methods are available to perform the simultaneous sintering. That is, the sintering may be performed for all of the constitutive films of the ceramic green stack 58 and the piezoelectric/electrostrictive elements 24a, 24b. The first electrode 28 and the ceramic green stack 58 may be simultaneously sintered, or the other constitutive films except for the second electrode 30 and the ceramic green stack 58 may be simultaneously sintered.

The following method is available to simultaneously sinter the piezoelectric/electrostrictive elements 24a, 24b and the ceramic green stack 58. That is, precursors of the piezoelectric/electrostrictive layers 26 are formed, for example, in accordance with the tape formation method based on the use of a slurry material. The precursors of the piezoelectric/electrostrictive layers 26, before the sintering, are stacked on the surfaces of the ceramic green stack 58, for example, by means of a thermal securing process under pressure, followed by the simultaneous sintering to produce the movable section 20, the thin plate sections 16a, 16b, the piezoelectric/electrostrictive layers 26, and the fixation section 22. However, in this method, it is necessary to form the electrodes 28 on the surfaces of the ceramic green stack 58 or on the piezoelectric/electrostrictive layers 26 by using the film formation method described above.

Another method is also available. That is, the electrodes 28, 30 and the piezoelectric/electrostrictive layers 26, which are the respective constitutive layers of the piezoelectric/electrostrictive elements 24a, 24b, are formed by means of the screen printing on portions to be subsequently formed into at least the thin plate sections 16a, 16b of the ceramic green stack 58, followed by the simultaneous sintering.

The sintering temperature of the constitutive film of the piezoelectric/electrostrictive element 24a, 24b is appropriately determined depending on the material for constructing the same. However, the sintering temperature is generally 500° C. to 1500° C. The sintering temperature is preferably 1000° C. to 1400° C. for the piezoelectric/electrostrictive layer 26. In this case, in order to control the composition of the piezoelectric/electrostrictive layer 26, the sintering is preferably performed in the presence of an evaporation source of the selected material of the piezoelectric/electrostrictive layer 26. When the piezoelectric/electrostrictive layers 26 and the ceramic green stack 58 are simultaneously sintered, it is necessary to conform the sintering conditions of both. The piezoelectric/electrostrictive element 24a, 24b is not necessarily formed on both surfaces of the ceramic stack 60 or the ceramic green stack 58. It is of course allowable to form the piezoelectric/electrostrictive element 24a, 24b on only one surface.

Subsequently, unnecessary portions are cut off from the ceramic stack 60 formed with the piezoelectric/electrostrictive elements 24a, 24b as described above. The cutoff positions are located at side portions of the ceramic stack 60, especially at portions at which the hole 12 based on the window 54 is formed on the side surfaces of the ceramic stack 60 by means of the cutoff (see cutting lines C1 and C2 in FIG. 17).

Figure 18:
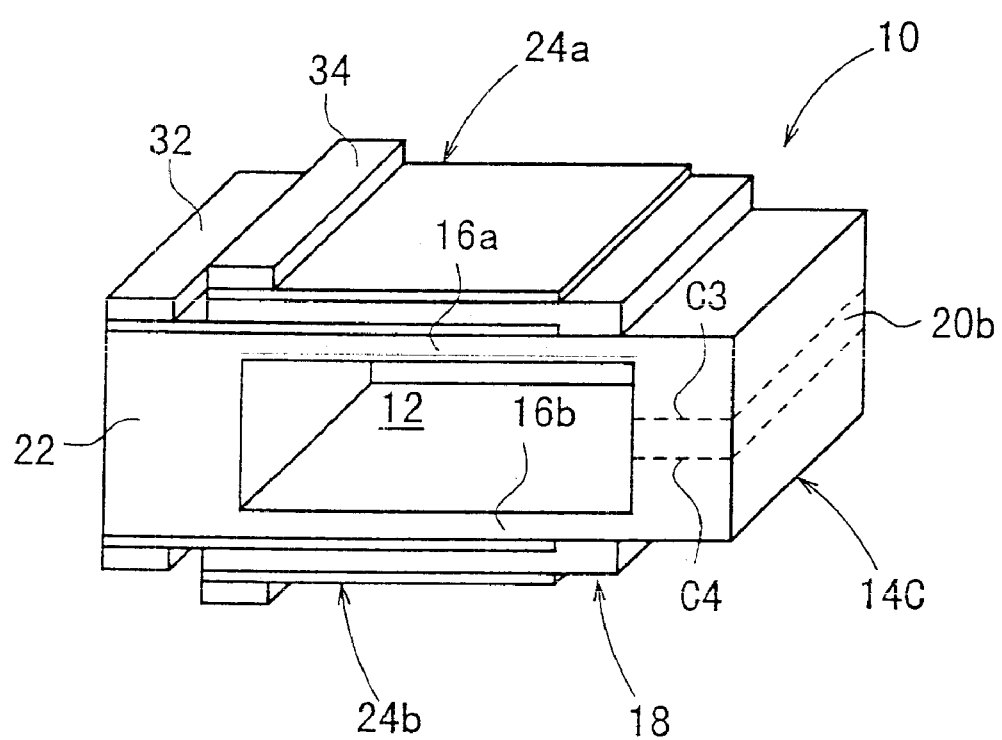
FIG. 18 illustrates an intermediate process in the first production method in which the ceramic stack is cut along predetermined cutting lines to provide the piezoelectric/electrostrictive device according to the embodiment of the present invention.

Subsequently, as shown in FIG. 18, a central portion 20b of the portion to be formed into the movable section 20 is removed by means of a cutoff along cutting lines C3 and C4 to produce the piezoelectric/electrostrictive device 10 comprising the piezoelectric/electrostrictive elements 24a, 24b formed on the ceramic substrate 14 integrated with the movable section 20, the thin plate sections 16a, 16b, and the fixation section 22. Those applicable as the cutoff method include a mechanical machining method such as a dicing machining and a wire saw machining as well as an electron beam machining and a laser machining based on the use of, for example, the YAG laser and the excimer laser.

Figure 19A:
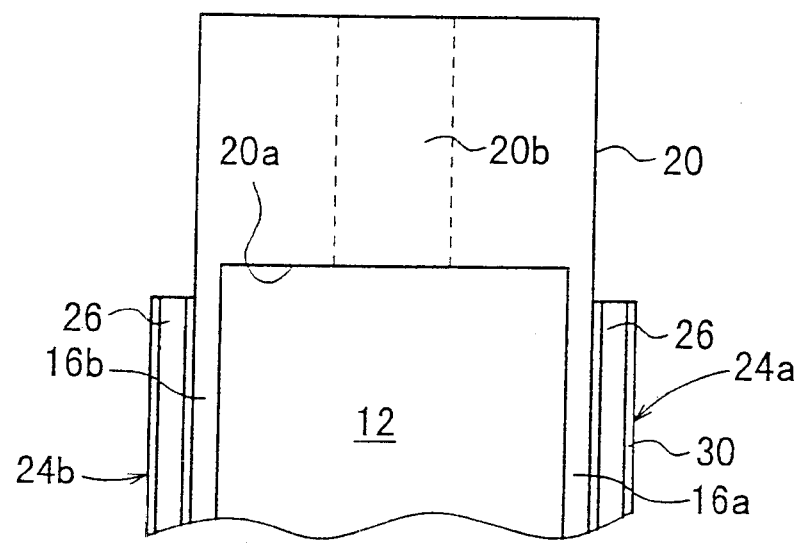
FIG. 19A illustrates a state in which the internal residual stress is generated in thin plate sections and piezoelectric/electrostrictive layers.

In the production method for the piezoelectric/electrostrictive device described above, the piezoelectric/electrostrictive elements 24a, 24b are formed on the thin plate sections 16a, 16b by means of an integrated sintering. Therefore, as shown in FIG. 19A, for example, the thin plate sections 16a, 16b and the piezoelectric/electrostrictive elements 24a, 24b are slightly displaced to be convex toward the hole 12, to be a state in which the strain is generated in shape, for example, due to the shrinkage of the piezoelectric/electrostrictive layers 26 caused during sintering and the difference in coefficient of thermal expansion among the pair of electrodes 28, 30, the piezoelectric/electrostrictive layers 26, and the thin plate sections 16a, 16b. As a result, the internal residual stress tends to arise in the piezoelectric/electrostrictive elements 24a, 24b (especially in the piezoelectric/electrostrictive layers 26) and in the thin plate sections 16a, 16b.

The internal residual stress in the thin plate sections 16a, 16b and the piezoelectric/electrostrictive layers 26 is generated when the integrated sintering is performed as described above as well as when separate members of the piezoelectric/electrostrictive elements 24a, 24b are glued to the thin plate sections 16a, 16b, for example, with an adhesive. That is, the internal residual stress is generated in the thin plate sections 16a, 16b and the piezoelectric/electrostrictive layers 26 due to the curing and shrinkage of the adhesive or the like when the adhesive is immobilized or cured. When heating is required for the immobilization or curing, the residual stress is increased.

If the piezoelectric/electrostrictive device 10 is used in this state, the movable section 20 does not exhibit any desired displacement even when the predetermined electric field is generated in the piezoelectric/electrostrictive layers 26, because of the following reason. That is, the material characteristic of the piezoelectric/electrostrictive layers 26 and the displacement action of the movable section 20 are inhibited by the internal residual stress generated in the thin plate sections 16a, 16b and the piezoelectric/electrostrictive layers 26.

Figure 19B:
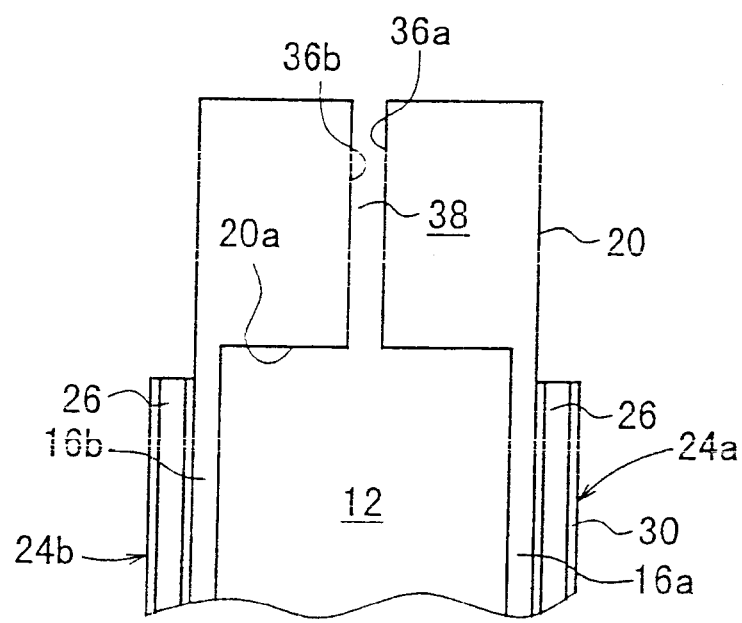
FIG. 19B illustrates a state in which a central portion of the movable section is cut off.

In the first production method, as shown in FIG. 19A, the central portion 20b of the movable section 20 is cut off by a predetermined width W1 (for example, 100 μm). When the central portion 20b is cut off, the mutually opposing end surfaces 36a, 36b are formed in the movable section 20 as shown in FIG. 19B. The end surfaces 36a, 36b are moved to make approach to one another by the internal residual stress having been generated in the thin plate sections 16a, 16b and the piezoelectric/electrostrictive layers 26. The width between the respective end surfaces 36a, 36b after the movement is, for example, a second predetermined width W2 (for example, 30 μm) which is shorter than the predetermined width W1.

The movement of the end surfaces 36a, 36b results from the release of the internal residual stress having been generated in the thin plate sections 16a, 16b and the piezoelectric/electrostrictive layers 26. When the piezoelectric/electrostrictive device 10 is used in a state in which the internal residual stress is released, then the movable section exhibits the displacement action as approximately designed, and good device characteristics are exhibited. This effect is equivalently obtained when a part of the portion to be formed into the fixation section 22 is cut off to form the mutually opposing end surfaces 36a, 36b in the fixation section 22, for example, as shown in FIG. 3. In this case, the internal residual stress, which has been generated in the thin plate sections 16a, 16b and the piezoelectric/electrostrictive layers 26, is released by the movement of the mutually opposing end surfaces 36a, 36b formed in the fixation section 22. The mutually opposing end surfaces 36a, 36b are not necessarily formed by cutting off the central portion of the movable section 20 or the fixation section 22. An equivalent effect is also obtained even when the mutually opposing end surfaces 36a, 36b are formed by cutting a portion deviated from the center.

When the cutoff as shown in FIG. 17 and the cutoff as shown in FIG. 18 are performed, it is preferable that a heat treatment is performed at 300 to 800° C. after the cutoff, because of the following reason. That is any defect, such as microcrack, that occurs in the device as a result of the machining, can be removed by means of the heat treatment described above, and the reliability is improved. Further, it is preferable to apply an aging treatment (i.e., by being left to stand for at least 10 hours at a temperature of about 80° C.) after the heat treatment, because of the following reason. That is, when an aging treatment is performed, for example, the various stresses, which have been exerted during the production process, can be further mitigated to contribute to the improvement in device characteristics.

Next, a second production method will be explained with reference to FIGS. 20A to 22. At first, as shown in FIG. 20A, a plurality (for example, four) of ceramic green sheets 50A to 50D each of which is formed with a window 54 for forming at least the hole 12 thereafter, a ceramic green sheet 102 which is continuously formed with a window 54 for forming the hole 12 thereafter and a window 100 for forming the movable section 20 having the mutually opposing end surfaces 36a, 36b, and a plurality (for example, two) of ceramic green sheets 52A, 52B to be formed into the thin plate sections 16a, 16b thereafter are prepared.

Figure 20B:
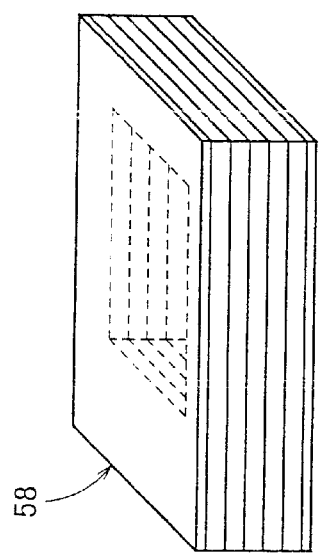
FIG. 20B illustrates a state in which a ceramic green stack is formed.
Figure 20A:
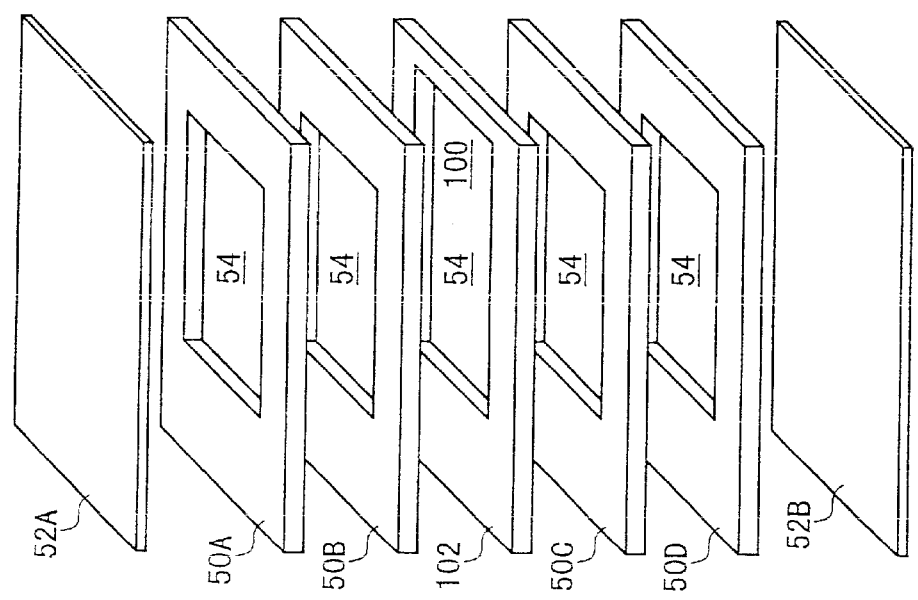
FIG. 20A illustrates a process for stacking necessary ceramic green sheets in a second production method.

After that, as shown in FIG. 20B, the ceramic green sheets 50A to 50D, 52A, 52B and 102 are stacked and secured under pressure so that the ceramic green sheets 50A to 50D and 102 are interposed between the ceramic green sheets 52A, 52B to form a ceramic green stack 58. The stacking is performed while the ceramic green sheet 102 is positioned at the center. During this process, there may be portions on which no pressure is applied while attempting to secure under pressure, due to the presence of the window 100. Therefore, for example, it is necessary that the order of the stacking and pressure-securing is changed to eliminate such portions where no pressure is applied. This procedure is also significant in the third and fourth production methods described below. After that, the ceramic green stack 58 is sintered to obtain the ceramic stack 60 (see FIG. 21).

Figure 21:
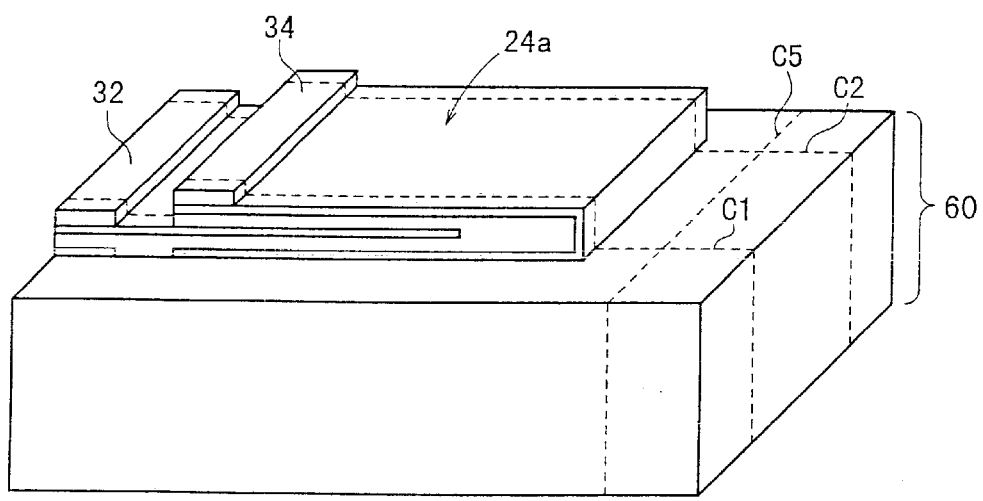
FIG. 21 illustrates a state in the second production method in which the ceramic green stack is converted into a sintered ceramic stack, and then a piezoelectric/electrostrictive element is formed on the ceramic stack.

Subsequently, as shown in FIG. 21, the piezoelectric/electrostrictive elements 24a, 24b having the multilayered structure are formed respectively on both surfaces of the ceramic stack 60, i.e., on the surfaces corresponding to the surfaces at which the ceramic green sheets 52A, 52B are stacked. The piezoelectric/electrostrictive elements 24a, 24b are integrated into the ceramic stack 60 by means of sintering. Of course, it is allowable to form the piezoelectric/electrostrictive element on only one side surface. This fact also holds for the third and fourth production methods described below.

Figure 22:
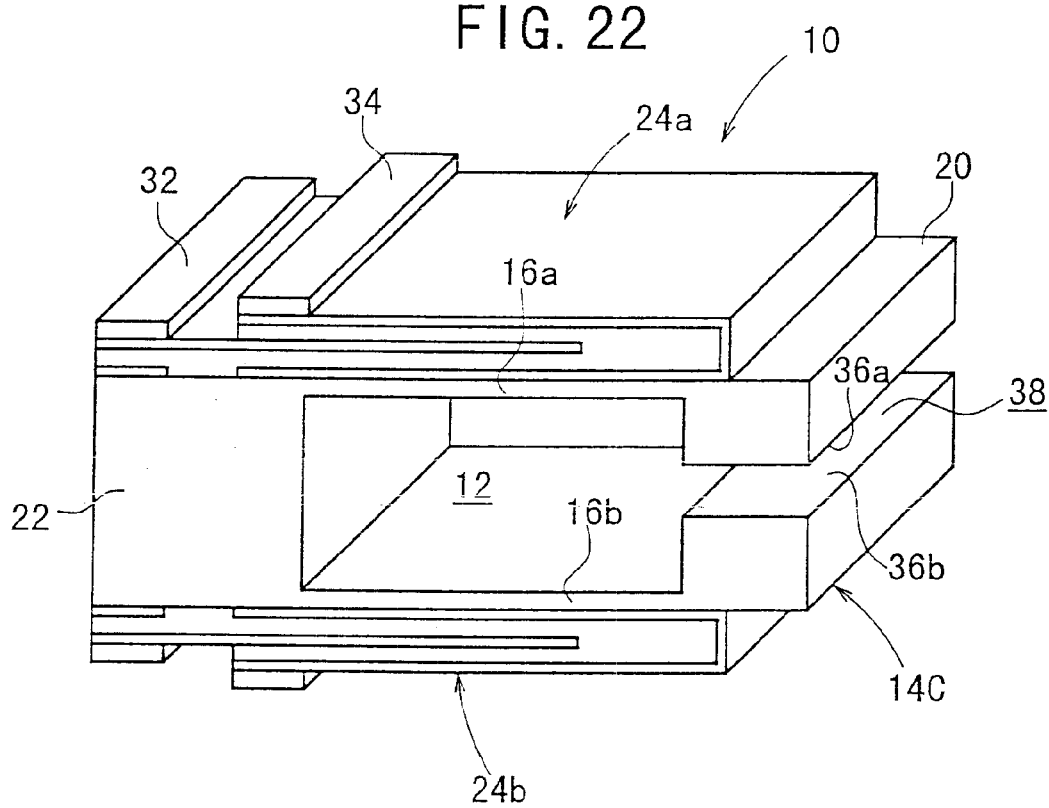
FIG. 22 illustrates a state in the second production method in which the ceramic stack is cut along predetermined cutting lines to provide the piezoelectric/electrostrictive device according to the embodiment of the present invention.

Subsequently, the ceramic stack 60, which is formed with the piezoelectric/electrostrictive elements 24a, 24b, is cut along cutting lines C1, C2, C5 to thereby cut off side portions and forward end portions of the ceramic stack 60. As a result of the cutoff, as shown in FIG. 22, the piezoelectric/electrostrictive device 10 is obtained, which is formed with the movable section 20 having the mutually opposing end surfaces 36a, 36b in which the piezoelectric/electrostrictive elements 24a, 24b are formed on the ceramic substrate 14C. The following cutting timing is available. That is, the ceramic stack 60 may be cut along the cutting lines C1 and C2, and then it may be cut along the cutting line C5. Alternatively, the ceramic stack 60 may be cut along the cutting line C5, and then it may be cut along the cutting lines C1 and C2. Of course, it is also preferable to perform the foregoing cutting procedures concurrently.

In the second production method, the piezoelectric/electrostrictive elements 24a, 24b are formed on the ceramic substrate 14C simultaneously with the cutoff of the unnecessary portions from the ceramic stack 60, making it possible to obtain the piezoelectric/electrostrictive device 10 formed with the movable section 20 having the mutually opposing end surfaces 36a, 36b. Accordingly, it is possible to simplify the production steps. Further, it is possible to improve the yield of the piezoelectric/electrostrictive device 10.

Next, a third production method will be explained with reference to FIGS. 23A to 25. At first, as shown in FIG. 23A, a plurality (for example, four) of ceramic green sheets 50A to 50D each of which is formed with a window 54 for forming at least the hole 12 thereafter, a ceramic green sheet 108 which is continuously formed with a window 54 for forming the hole 12 thereafter and a window 104 for forming a portion 20D to be formed into the movable section 20 with the mutually opposing end surfaces 36a, 36b partially connected to one another and which is formed with a projection 106 partially protruding toward the window 54, and a plurality (for example, two) of ceramic green sheets 52A, 52B to be formed into the thin plate sections 16a, 16b thereafter are prepared.

Figure 23B:
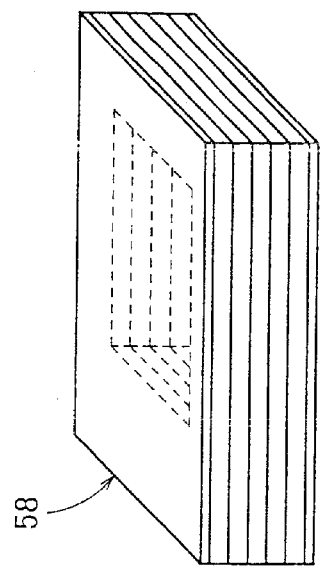
FIG. 23B illustrates a state in which a ceramic green stack is formed.
Figure 23A:
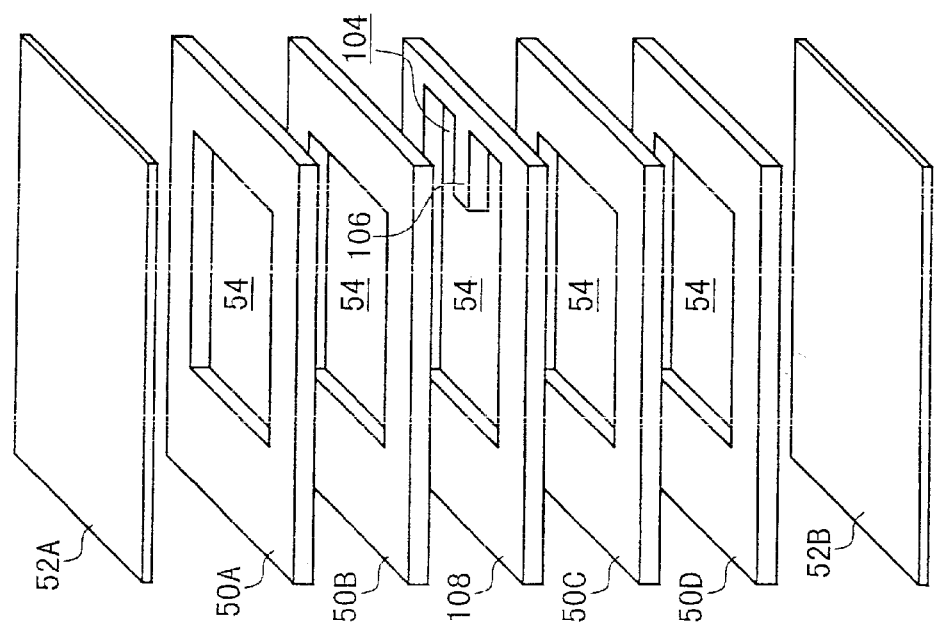
FIG. 23A illustrates a process for stacking necessary ceramic green sheets in a third production method.

After that, as shown in FIG. 23B, the ceramic green sheets 50A to 50D, 52A, 52B and 108 are stacked and secured under pressure so that the ceramic green sheets 50A to 50D and 108 are interposed between the ceramic green sheets 52A, 52B to form a ceramic green stack 58. The stacking is performed while the ceramic green sheet 108 is positioned at the center. After that, the ceramic green stack 58 is sintered to obtain the ceramic stack 60 (see FIG. 24).

Figure 24:
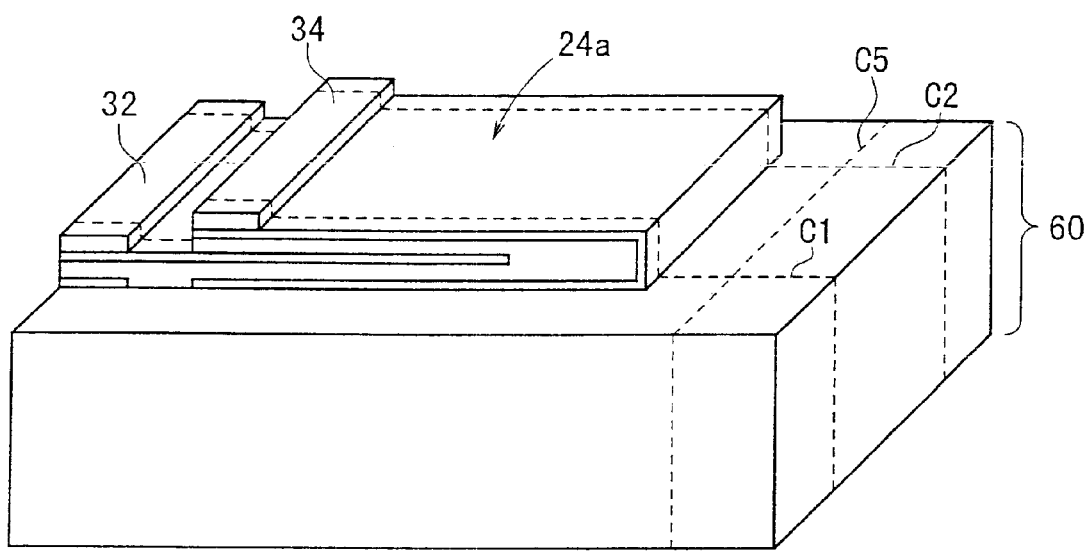
FIG. 24 illustrates a state in the third production method in which the ceramic green stack is converted into a sintered ceramic stack, and then a piezoelectric/electrostrictive element is formed on the ceramic stack.

Subsequently, as shown in FIG. 24, the piezoelectric/electrostrictive elements 24a, 24b having a multilayered structure are formed respectively on both surfaces of the ceramic stack 60, i.e., on the surfaces corresponding to the surfaces at which the ceramic green sheets 52A, 52B are stacked. The piezoelectric/electrostrictive elements 24a, 24b are integrated into the ceramic stack 60 by means of sintering.

Figure 25:
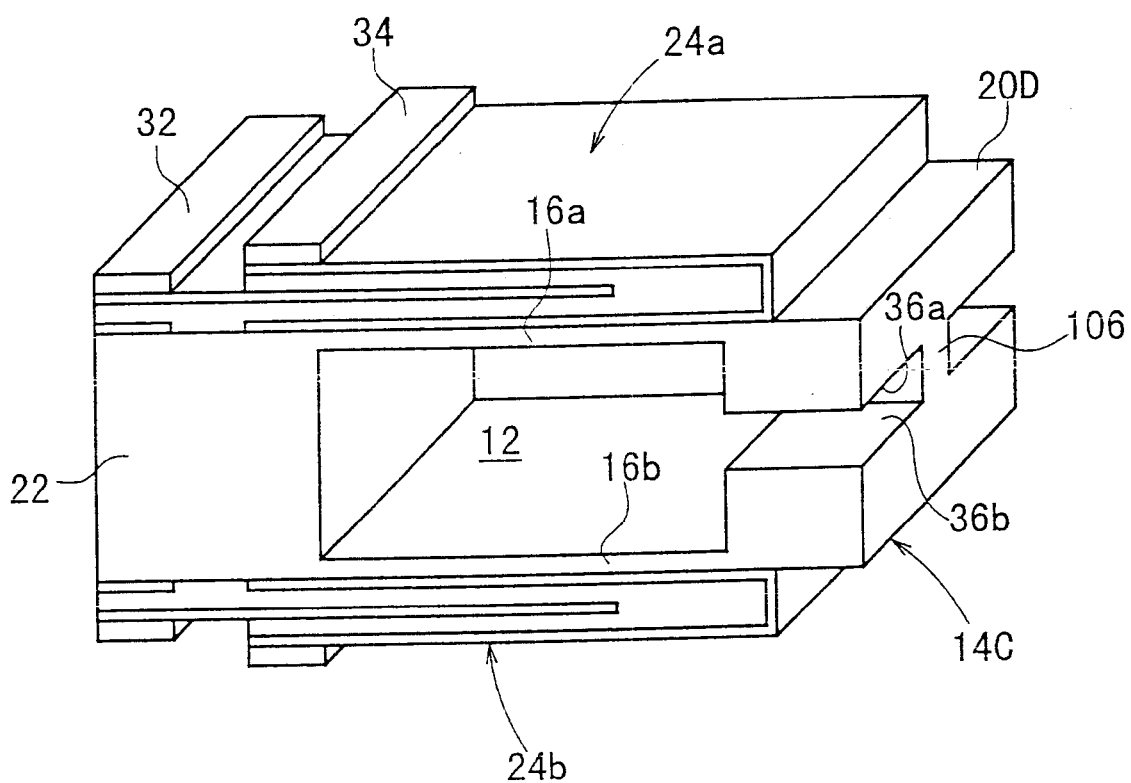
FIG. 25 illustrates an intermediate process in the third production method in which the ceramic stack is cut along predetermined cutting lines to provide the piezoelectric/electrostrictive device according to the embodiment of the present invention.

Subsequently, the ceramic stack 60, which is formed with the piezoelectric/electrostrictive elements 24a, 24b, is cut along cutting lines C1, C2, CS to thereby cut off side portions and forward end portions of the ceramic stack. As a result of the cutoff, as shown in FIG. 25, the fixation section 22, the thin plate sections 16a, 16b, and the piezoelectric/electrostrictive elements 24a, 24b are formed. However, the portion 20D to be formed into the movable section 20 is in a state in which the mutually opposing end surfaces 36a, 36b are partially connected to one another by a projection 106.

Subsequently, the projection 106, which partially connects the mutually opposing end surfaces 36a, 36b, is cut off to produce the piezoelectric/electrostrictive device 10 in which the piezoelectric/electrostrictive elements 24a, 24b are formed on the ceramic substrate 14C integrated with the movable section 20, thin plate sections 16b, and the fixation section 22.

In the third production method, it is sufficient that the slender projection 106, which partially connects the mutually opposing end surfaces 36a, 36b, is cut off at the final stage. Accordingly, the cutoff procedure can be performed easily and reliably, and thus it is possible to simplify the production steps. Further, it is possible to improve the yield of the piezoelectric/electrostrictive device 10.

Next, a fourth production method will be explained with reference to FIGS. 26A to 28. At first, as shown in FIG. 26A, a plurality (for example, four) of ceramic green sheets 50A to 50D each of which is formed with a window 54 for forming at least the hole 12 thereafter, a ceramic green sheet 114 which is formed with a window 54 to be formed into the hole 12 thereafter and a window 110 for forming a portion 20D to be formed into the movable section 20 with the mutually opposing end surfaces 36a, 36b partially connected to one another and which is formed with a crosspiece 112 to separate the window 54 and the window 110 from each other, and a plurality (for example, two) of ceramic green sheets 52A, 52B to be formed into the thin plate sections 16a, 16b thereafter are prepared.

Figure 26B:
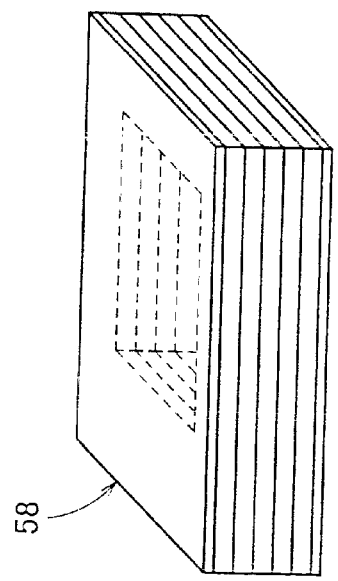
FIG. 26B illustrates a state in which a ceramic green stack is formed.
Figure 26A:
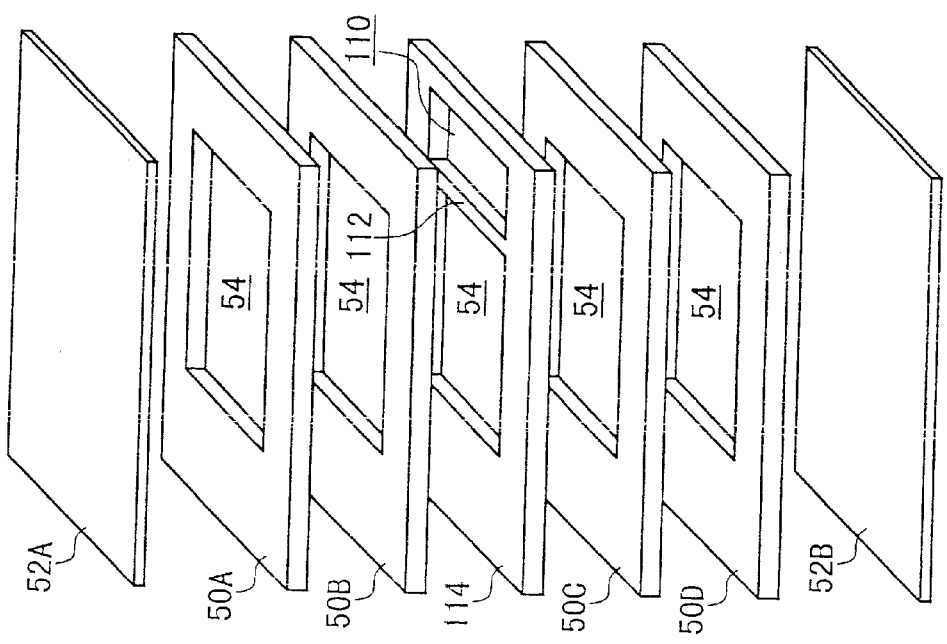
FIG. 26A illustrates a process for stacking necessary ceramic green sheets in a fourth production method.

After that, as shown in FIG. 26B, the ceramic green sheets 50A to 50D, 52A, 52B and 114 are stacked and secured under pressure so that the ceramic green sheets 50A to 50D and 114 are interposed between the ceramic green sheets 52A, 52B to form a ceramic green stack 58. The stacking is performed while the ceramic green sheet 114 is positioned at the center. After that, the ceramic green stack 58 is sintered to obtain the ceramic stack 60 (see FIG. 27).

Figure 27:
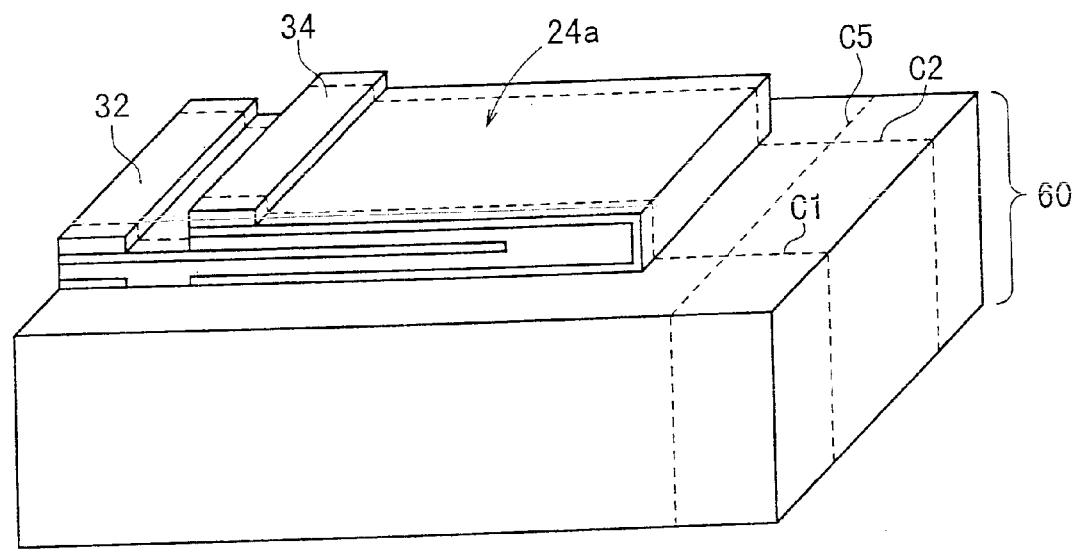
FIG. 27 illustrates a state in the fourth production method in which the ceramic green stack is converted into a sintered ceramic stack, and then a piezoelectric/electrostrictive element is formed on the ceramic stack.

Subsequently, as shown in FIG. 27, the piezoelectric/electrostrictive elements 24a, 24b having a multilayered structure are formed respectively on both surfaces of the ceramic stack 60, i.e., on the surfaces corresponding to the surfaces at which the ceramic green sheets 52A, 52B are stacked. The piezoelectric/electrostrictive elements 24a, 24b are integrated into the ceramic stack 60 by means of sintering.

Figure 28:
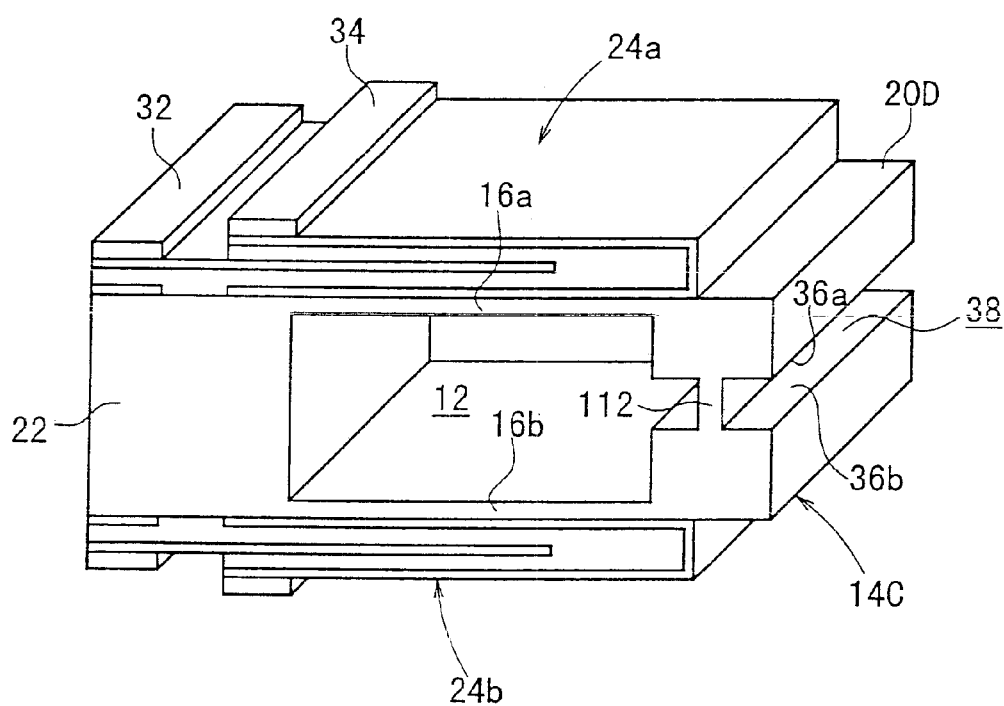
FIG. 28 illustrates an intermediate process in the fourth production method in which the ceramic stack is cut along predetermined cutting lines to provide the piezoelectric/electrostrictive device according to the embodiment of the present invention.

Subsequently, the ceramic stack 60, which is formed with the piezoelectric/electrostrictive elements 24a, 24b, is cut along cutting lines C1, C2, C5 to thereby cut off side portions and forward end portions of the ceramic stack. As a result of the cutoff, as shown in FIG. 28, the fixation section 22, the thin plate sections 16a, 16b, and the piezoelectric/electrostrictive elements 24a, 24b are formed. However, the portion 20D to be formed into the movable section 20 is in a state in which the mutually opposing end surfaces 36a, 36b are partially connected to one another by the crosspiece 112.

Subsequently, the crosspiece 112, which partially connects the mutually opposing end surfaces 36a, 36b, is cut off to produce the piezoelectric/electrostrictive device 10 in which piezoelectric/electrostrictive elements 24a, 24b are formed on the ceramic substrate 14C integrated with the movable section 20, thin plate sections 16a, 16b, and fixation section 22.

In the fourth production method, it is sufficient that the crosspiece 112, which partially connects the mutually opposing end surfaces 36a, 36b, is cut off at the final stage. Accordingly, the cutoff procedure can be performed easily and reliably, and thus it is possible to simplify the production steps. Further, it is possible to improve the yield of the piezoelectric/electrostrictive device 10.

The embodiments described above are illustrative of the case in which the movable section 20, the fixation section 22, and the thin plate sections 16a, 16b are constructed with a ceramic substrate, i.e., 14C. Alternatively, each of the parts may be made of a metal material. Further alternatively, each of the parts may be made to provide a hybrid structure obtained by combining those produced with materials of ceramics and metal. In this case, in order to join the metal materials to one another and/or join the ceramic and metal materials to one another, it is possible to use adhesion with organic resin or glass, brazing, soldering, eutectic bonding, or welding.

Explanation will be made with reference to FIGS. 29A to 36, for example, for production methods (fifth and sixth production methods) for piezoelectric/electrostrictive devices (piezoelectric/electrostrictive devices 10h and 10i according to the eighth and ninth modified embodiments) having the hybrid structure in which the movable section 20 and the fixation section 22 are made of ceramics, and the thin plate sections 16a, 16b are made of metal. Therefore, the substrate containing metal and ceramics, which is produced by the fifth and sixth production methods, is referred to as the substrate 14D.

Figure 29B:
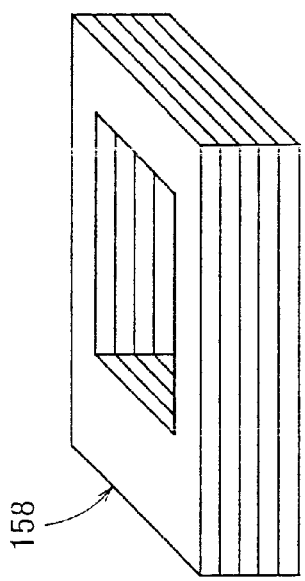
FIG. 29B illustrates a state in which a ceramic green stack is formed.
Figure 29A:
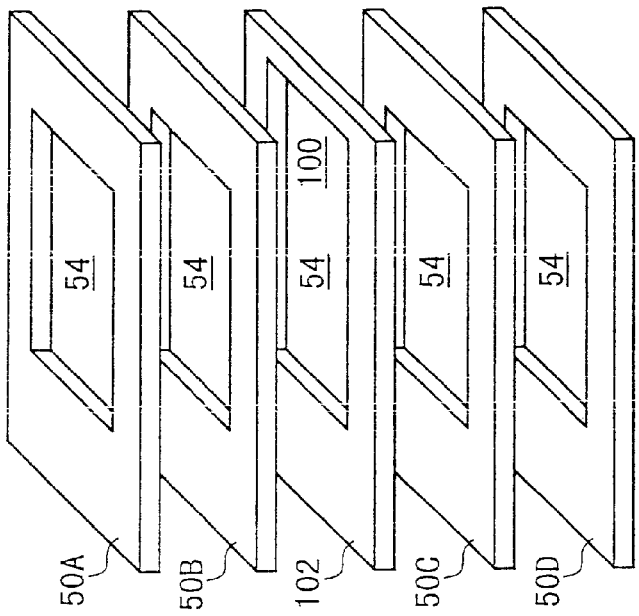
FIG. 29A illustrates a process for stacking necessary ceramic green sheets in a fifth production method.

In the fifth production method, at first, as shown in FIG. 29A, a plurality (for example, four) of ceramic green sheets 50A to 50D each of which is formed with a window 54 for forming at least the hole 12 thereafter, and a ceramic green sheet 102 which is continuously formed with a window 54 for forming the hole 12 thereafter and a window 100 for forming the movable section 20 having the mutually opposing end surfaces 36a, 36b are prepared.

After that, as shown in FIG. 29B, the ceramic green sheets 50A to 50D, 102 are stacked and secured under pressure to form a ceramic green stack 158. The stacking is performed while the ceramic green sheet 102 is positioned at the center. After that, as shown in FIG. 30A, the ceramic green stack 158 is sintered to obtain a ceramic stack 160 (see FIG. 30A). At this stage, the ceramic stack 160 is formed such that the hole 130 is formed by the windows 54, 100.

Figure 30B:
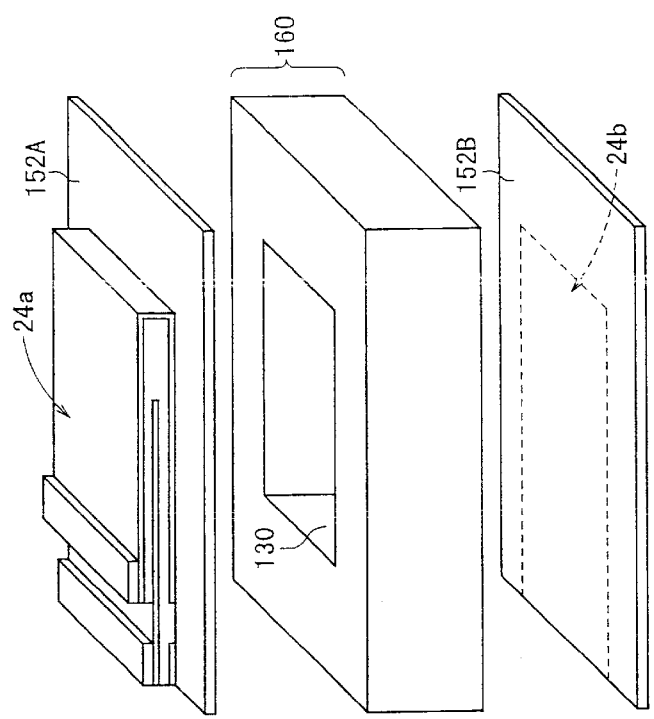
FIG. 30B illustrates a state in which piezoelectric/electrostrictive elements, which are constructed as separate members, are glued to surfaces of metal plates to serve as thin plate sections respectively.
Figure 30A:
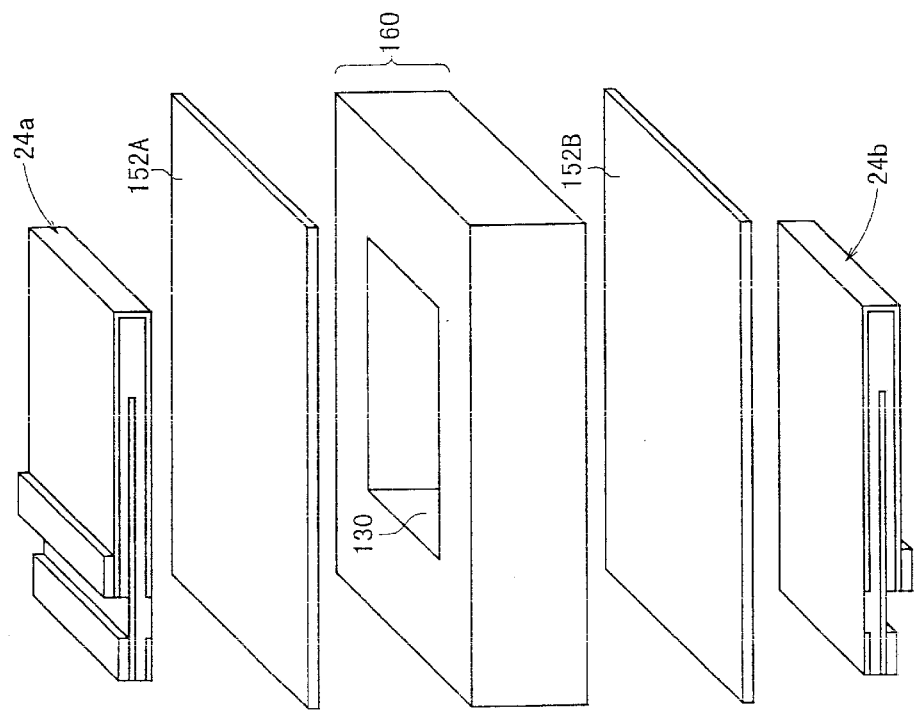
FIG. 30A illustrates a state in which the ceramic green stack is sintered to provide a ceramic stack.

Subsequently, as shown in FIG. 30B, the piezoelectric/electrostrictive elements 24a, 24b, Which are constructed as separate members, are respectively glued with an epoxy adhesive to the surfaces of metal plates 152A, 152B to serve as the thin plate sections. The separate members of the piezoelectric/electrostrictive elements 24a, 24b can be formed, for example, in accordance with a ceramic green sheet-stacking method.

Subsequently, the metal plates 152A, 152B are glued to the ceramic stack 160 with the epoxy adhesive so that the ceramic stack 160 is interposed between the metal plates 152A, 152B and the hole 130 is closed thereby to provide a hybrid stack 162 (see FIG. 31).

Figure 31:
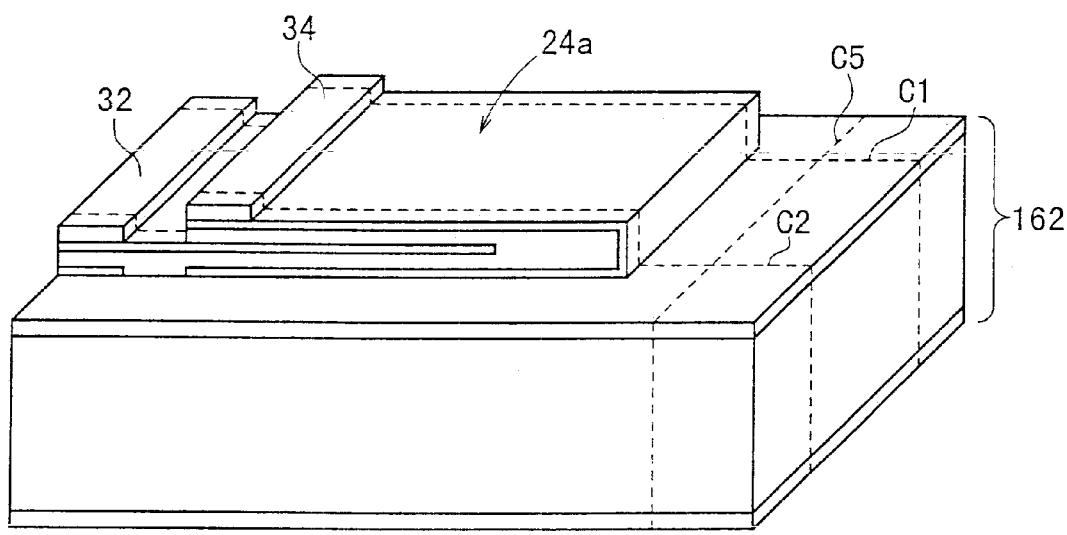
FIG. 31 illustrates a state in the fifth production method in which the metal plate is glued to the ceramic stack to provide a hybrid stack.
Figure 32:
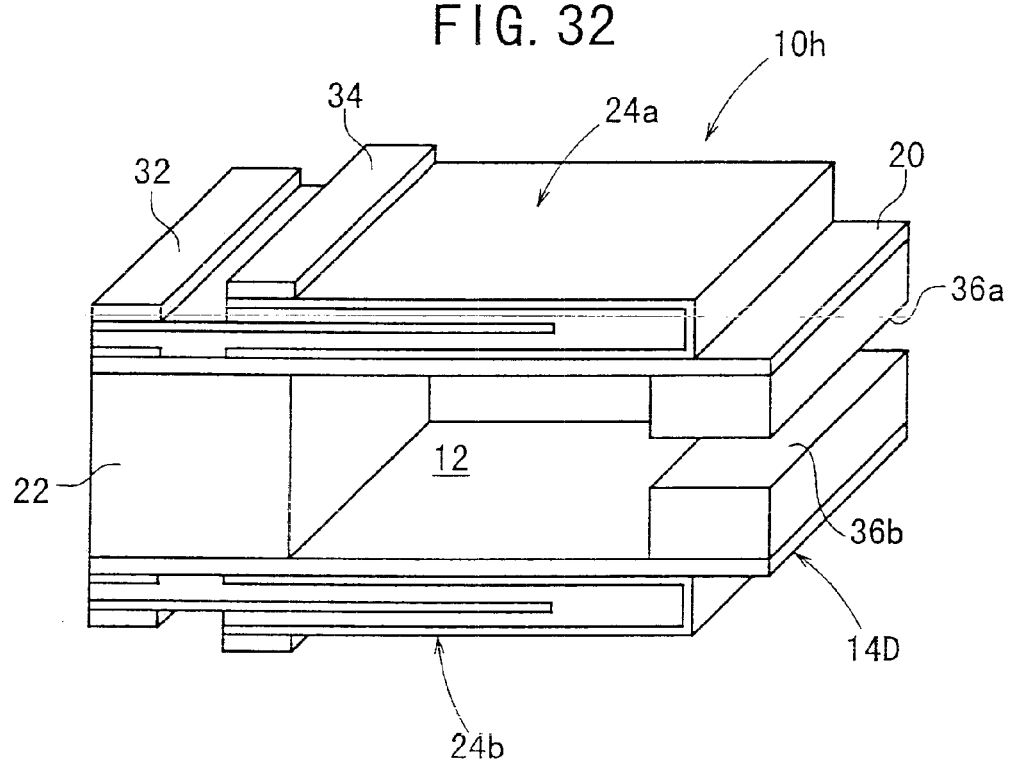
FIG. 32 illustrates a state in the fifth production method in which the hybrid stack is cut along predetermined cutting lines to provide the piezoelectric/electrostrictive device according to the eighth modified embodiment.

Subsequently, as shown in FIG. 31, the hybrid stack 162, which is formed with the piezoelectric/electrostrictive elements 24a, 24b, is cut along cutting lines C1, C2, C5 to thereby cut off side portions and forward end portions of the hybrid stack 162. As a result of the cutoff, as shown in FIG. 32, the piezoelectric/electrostrictive device 10h according to the eighth modified embodiment is obtained, in which the piezoelectric/electrostrictive elements 24a, 24b are formed on the thin plate sections constituted by the metal plates, of the substrate 14D, and the movable section 20 having the mutually opposing end surfaces 36a, 36b is formed.

Figure 33B:
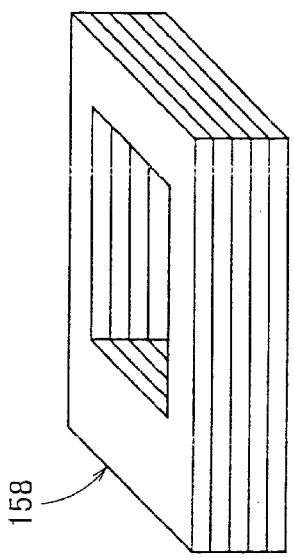
FIG. 33B illustrates a state in which a ceramic green stack is formed.
Figure 33A:
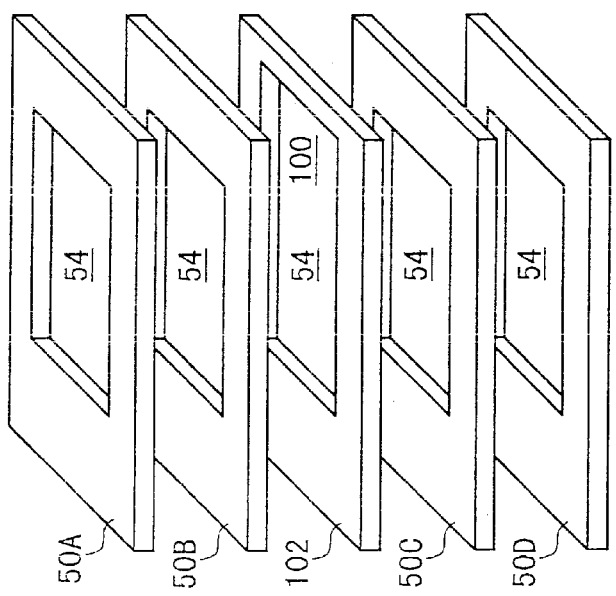
FIG. 33A illustrates a process for stacking necessary ceramic green sheets in a sixth production method.

On the other hand, in the sixth production method, at first, as shown in FIG. 33A, a plurality (for example, four) of ceramic green sheets 50A to 50D each of which is formed with a window 54 for forming at least the hole 12 thereafter, and a ceramic green sheet 102 which is continuously formed with a window 54 for forming the hole 12 thereafter and a window 100 for forming the movable section 20 having the mutually opposing end surfaces 36a, 36b are prepared.

After that, as shown in FIG. 33B, the ceramic green sheets 50A to 50D, 102 are stacked and secured under pressure to form a ceramic green stack 158. After that, the ceramic green stack 158 is sintered to obtain a ceramic stack 160 as shown in FIG. 34A. At this stage, the ceramic stack 160 is formed such that the hole 130 is formed by the windows 54, 100.

Figure 34B:
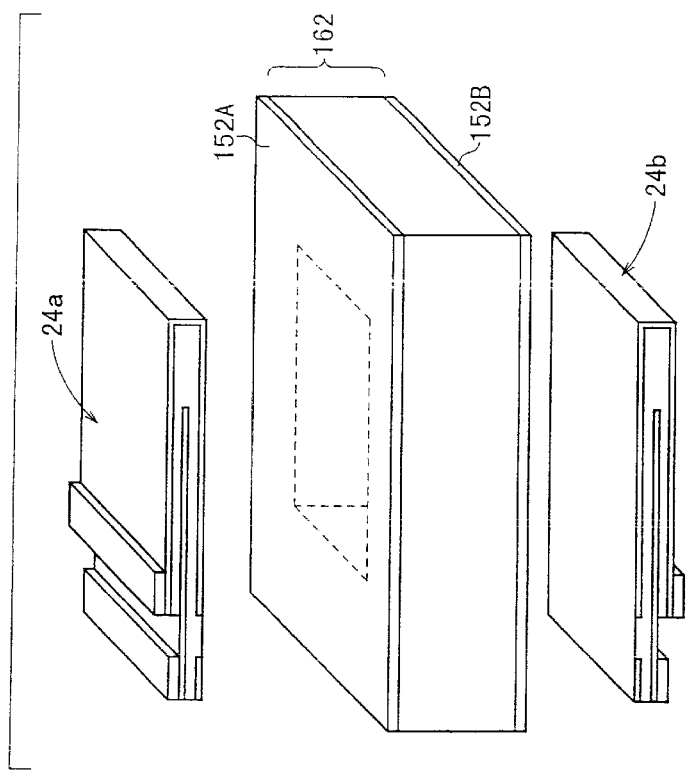
FIG. 34B illustrates a state in which metal plates to serve as thin plate sections respectively are glued to the ceramic stack to provide a hybrid stack.
Figure 34A:
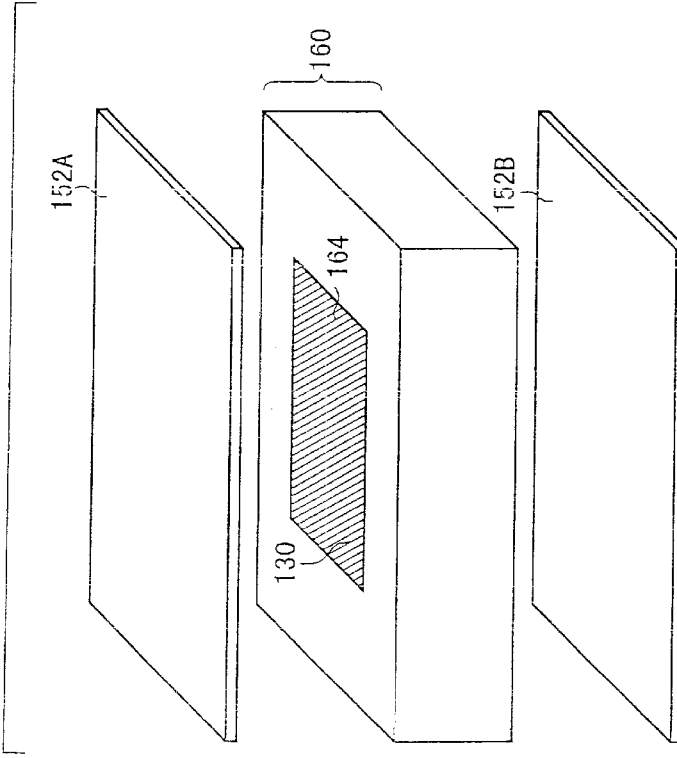
FIG. 34A illustrates a state in which the ceramic green stack is sintered to provide a ceramic stack, and then a hole is filled with a filler material.

Subsequently, as shown in FIG. 34B, the metal plates 152A, 152B are glued to the ceramic stack 160 with an epoxy adhesive so that the ceramic stack 160 is interposed between the metal plates 152A, 152B and the hole 130 is closed thereby to provide a hybrid stack 162. In this procedure, when the piezoelectric/electrostrictive elements 24a, 24b are stuck to the surfaces of the glued metal plates 152A, 152B, the hole 130 is optionally filled with a filler material 164 as shown in FIG. 34A so that a sufficient gluing pressure may be applied.

It is necessary to subsequently remove the filler material 164. Therefore, it is preferable to use a hard material which is easily dissolved in a solvent or the like. The material includes, for example, organic resin, wax, and brazing filler material. It is also possible to adopt a material obtained by mixing ceramic powder as a filler with organic resin such as acrylic.

Figure 35:
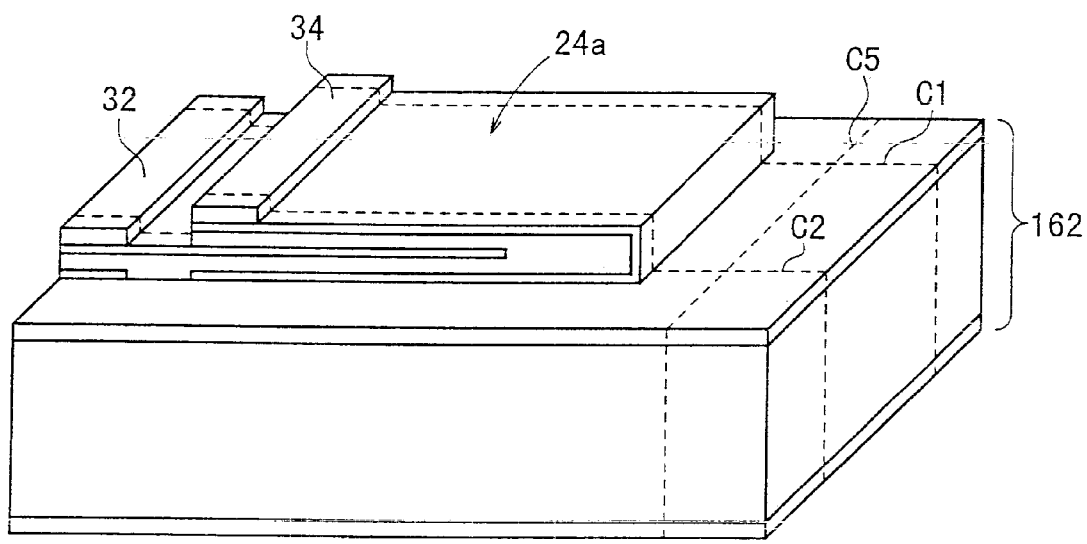
FIG. 35 illustrates a state in which a piezoelectric/electrostrictive element, which is constructed as a separate member, is glued to the surface of the metal plate of the hybrid stack.

Subsequently, as shown in FIG. 35, the piezoelectric/electrostrictive elements 24a, 24b, which are constructed as separate members, are glued with an epoxy adhesive to the surfaces of the metal plates 152A, 152B of the hybrid stack 162. The separate members of the piezoelectric/electrostrictive elements 24a, 24b can be formed, for example, in accordance with the ceramic green sheet-stacking method.

Figure 36:
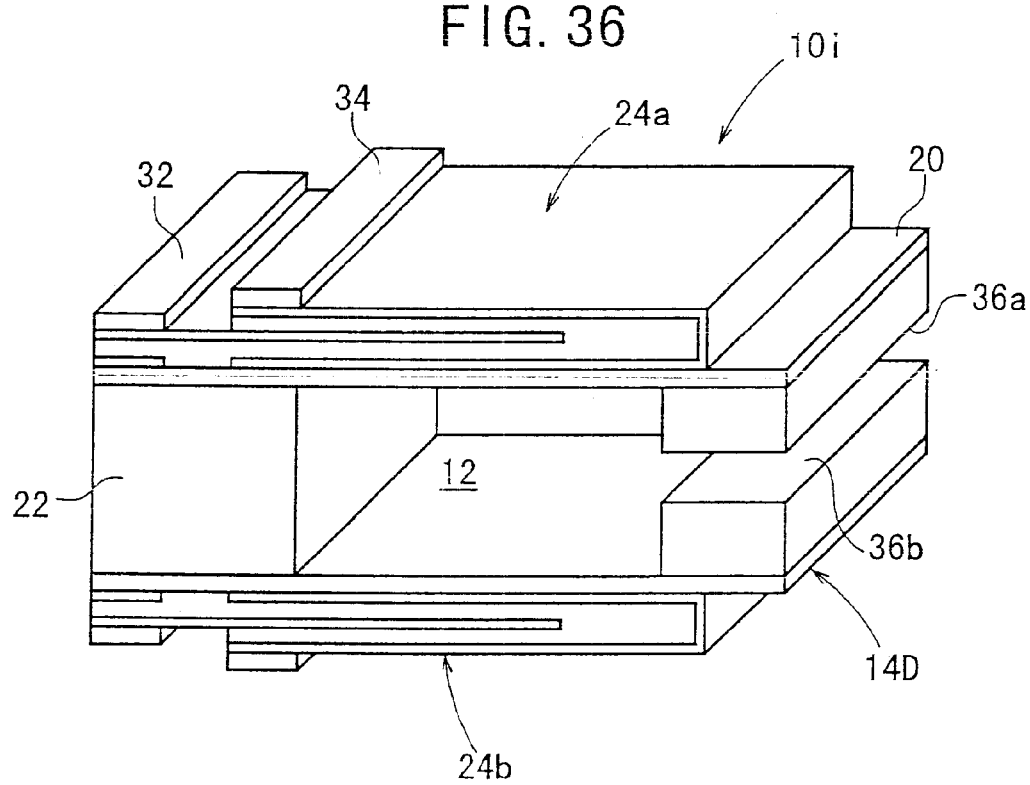
FIG. 36 illustrates a state in the sixth production method in which the hybrid stack is cut along predetermined cutting lines to provide the piezoelectric/electrostrictive device according to the ninth modified embodiment.

Subsequently, the hybrid stack 162, which is formed with the piezoelectric/electrostrictive elements 24a, 24b, is cut along cutting lines C1, C2, C5 to thereby cut off side portions and forward end portions of the hybrid stack 162. As a result of the cutoff, as shown in FIG. 36, the piezoelectric/electrostrictive device 10i according to the ninth modified embodiment is obtained, in which the piezoelectric/electrostrictive elements 24a, 24b are formed on the thin plate sections constituted by the metal plates, of the substrate 14D, and the movable section 20 having the mutually opposing end surfaces 36a, 36b is formed.

When all of the substrate section is made of metal, for example, the portions corresponding to the ceramic stack 160 shown in FIG. 30A are formed by means of molding. Further, thin metal materials may be stacked to form the substrate section in accordance with a cladding method.

The piezoelectric/electrostrictive device described above can be utilized as the active device in numerous applications, including, for example, various transducers, various actuators, frequency region functional parts (filters), transformers, vibrators, resonators, oscillators, and discriminators for the communication and the power generation. In addition, the piezoelectric/electrostrictive device described above may be used for the sensor element in various sensors including, for example, ultrasonic sensors, acceleration sensors, angular velocity sensors, shock sensors, and mass sensors. Especially, the piezoelectric/electrostrictive device described above can be preferably utilized for various actuators to be used for the mechanism for adjusting the displacement and the positioning and for adjusting the angle for various precision parts such as those of optical instruments and precision mechanical equipments.

It is a matter of course that the piezoelectric/electrostrictive device and the method for producing the same according to the present invention are not limited to the embodiments described above, which may be embodied in other various forms without deviating from the gist or essential characteristics of the present invention.

What is claimed is:

1. A method for producing a piezoelectric/electrostrictive device comprising:

a pair of mutually opposing thin plate sections, a movable section, and a fixation section for supporting said thin plate sections and said movable section;

one or more piezoelectric/electrostrictive elements arranged on at least one thin plate section of said pair of thin plate sections; and a hole formed by both inner walls of said pair of thin plate sections, an inner wall of said movable section, and an inner wall of said fixation section, said method comprising:

a step of forming said movable section or said fixation section having mutually opposing end surfaces by cutting off a predetermined part of any one of a portion to be formed into said movable section or a portion to be formed into said fixation section after producing at least said piezoelectric/electrostrictive element.

2. The method for producing said piezoelectric/electrostrictive device according to claim 1, further comprising a step of allowing a member different from a constitutive member of said movable section and said fixation section to intervene between said mutually opposing end surfaces.

3. The method for producing said piezoelectric/electrostrictive device according claim 2, wherein organic resin is used as said member.

4. A method for producing a piezoelectric/electrostrictive device comprising:

a pair of mutually opposing thin plate sections, a movable section, and a fixation section for supporting said thin plate sections and said movable section;

one or more piezoelectric/electrostrictive elements arranged on at least one thin plate section of said pair of thin plate sections; and a hole formed by both inner walls of said pair of thin plate sections, an inner wall of said movable section, and an inner wall of said fixation section; said method comprising:

a step of producing a ceramic stack by integrally sintering a ceramic green stack including at least a ceramic green sheet having a window for forming at least said hole thereafter and ceramic green sheets to be formed into said thin plate sections thereafter to produce said ceramic stack;

a step of forming said piezoelectric/electrostrictive element on an outer surface of a portion of said ceramic stack to be formed into said thin plate section; and a cutoff step of forming said movable section or said fixation section having at least mutually opposing end surfaces by means of at least one time of cutoff treatment for said ceramic stack formed with said piezoelectric/electrostrictive element.

5. The method for producing said piezoelectric/electrostrictive device according to claim 4, wherein:

in said step of producing said ceramic stack, said ceramic stack is produced by integrally sintering a ceramic green stack including a ceramic green sheet having a window for forming said movable section or said fixation section having at least said mutually opposing end surfaces, and said ceramic green sheets to be formed into said thin plate sections thereafter to produce said ceramic stack; and in said cutoff step, said movable section or said fixation section having at least said mutually opposing end surfaces is formed by means of said cutoff treatment for said ceramic stack formed with said piezoelectric/electrostrictive element.

6. The method for producing said piezoelectric/electrostrictive device according to claim 4, wherein:

in said step of producing said ceramic stack, said ceramic stack is produced by integrally sintering a ceramic green stack including a ceramic green sheet having a window for forming a portion to be formed into said movable section or a portion to be formed into said fixation section having at least said mutually opposing end surfaces partially connected to one another, and said ceramic green sheets to be formed into said thin plate sections thereafter to produce said ceramic stack; and in said cutoff step, said portion to be formed into said movable section or said portion to be formed into said fixation section having at least said mutually opposing end surfaces partially connected to one another is formed by means of said cutoff treatment for said ceramic stack formed with said piezoelectric/electrostrictive element, and said movable section or said fixation section having said mutually opposing end surfaces is formed by cutting off said connecting portion.

7. The method for producing said piezoelectric/electrostrictive device according to claim 4, wherein in said cutoff step, said hole is exposed by means of said cutoff treatment for said ceramic stack.

* * * * *

UNITED STATES PATENT AND TRADEMARK OFFICE
CERTIFICATE OF CORRECTION

PATENT NO.   : 6,566,789 B2
DATED        : May 20, 2003
INVENTOR(S)  : Yukihisa Takeuchi et al.

It is certified that error appears in the above-identified patent and that said Letters Patent is hereby corrected as shown below:

Title page,
Item [75], Inventors, please change: "Tsutomu Nanataki, Toyoaki (JP)" to -- Tsutomu Nanataki, Toyoake (JP) --
Item [56], References Cited, U.S. PATENT DOCUMENTS, please add:
-- 5,828,157      10/1998         Miki et al……………….. --

Signed and Sealed this

Twenty-third Day of September, 2003

JAMES E. ROGAN
*Director of the United States Patent and Trademark Office*